(12) United States Patent
Willmeroth et al.

(10) Patent No.: US 8,294,206 B2
(45) Date of Patent: Oct. 23, 2012

(54) INTEGRATED CIRCUIT DEVICE AND METHOD FOR ITS PRODUCTION

(75) Inventors: Armin Willmeroth, Augsburg (DE);
Winfried Kaindl, Unterhaching (DE);
Carolin Tolksdorf, Steinhoering (DE);
Michael Rueb, Faak am See (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/161,130

(22) Filed: Jun. 15, 2011

(65) Prior Publication Data
US 2011/0241104 A1 Oct. 6, 2011

Related U.S. Application Data

(62) Division of application No. 11/963,057, filed on Dec. 21, 2007, now abandoned.

(51) Int. Cl.
*H01L 29/66* (2006.01)
(52) U.S. Cl. .......... 257/329; 257/E27.081; 257/E29.118; 438/212
(58) Field of Classification Search .................. 257/329, 257/E27.081, E27.096, E29.118, E29.131, 257/E29.183, E29.198; 438/212
See application file for complete search history.

(56) References Cited

U.S. PATENT DOCUMENTS

| | | | |
|---|---|---|---|
| 5,047,813 A | 9/1991 | Harada | |
| 6,633,064 B2 * | 10/2003 | Auerbach et al. | 257/336 |
| 6,803,609 B1 * | 10/2004 | Werner et al. | 257/107 |
| 7,372,100 B2 | 5/2008 | Saito | |
| 7,576,393 B2 * | 8/2009 | Ono et al. | 257/341 |
| 7,652,326 B2 | 1/2010 | Kocon | |
| 2004/0056284 A1 | 3/2004 | Nagaoka et al. | |
| 2011/0042739 A1 * | 2/2011 | Cascio et al. | 257/329 |

FOREIGN PATENT DOCUMENTS

| | | |
|---|---|---|
| EP | 0119400 | 8/1987 |
| EP | 0837508 | 4/1998 |

OTHER PUBLICATIONS

Armin Willmeroth, Non-Final Office Action mailed Sep. 7, 2010 for U.S. Appl. No. 11/963,057.
Armin Willmeroth, Final Office Action mailed Mar. 15, 2011 for U.S. Appl. No. 11/963,057.

* cited by examiner

*Primary Examiner* — Eduardo A Rodela
(74) *Attorney, Agent, or Firm* — Dicke, Billig & Czaja, PLLC

(57) ABSTRACT

An integrated circuit device includes a semiconductor body fitted with a first electrode and a second electrode on opposite surfaces. A control electrode on an insulating layer controls channel regions of body zones for a current flow between the two electrodes. A drift section adjoining the channel regions comprises drift zones and charge compensation zones. A part of the charge compensation zones includes conductively connected charge compensation zones electrically connected to the first electrode. Another part includes nearly-floating charge compensation zones, so that an increased control electrode surface has a monolithically integrated additional capacitance $C_{ZGD}$ in a cell region of the semiconductor device.

12 Claims, 25 Drawing Sheets

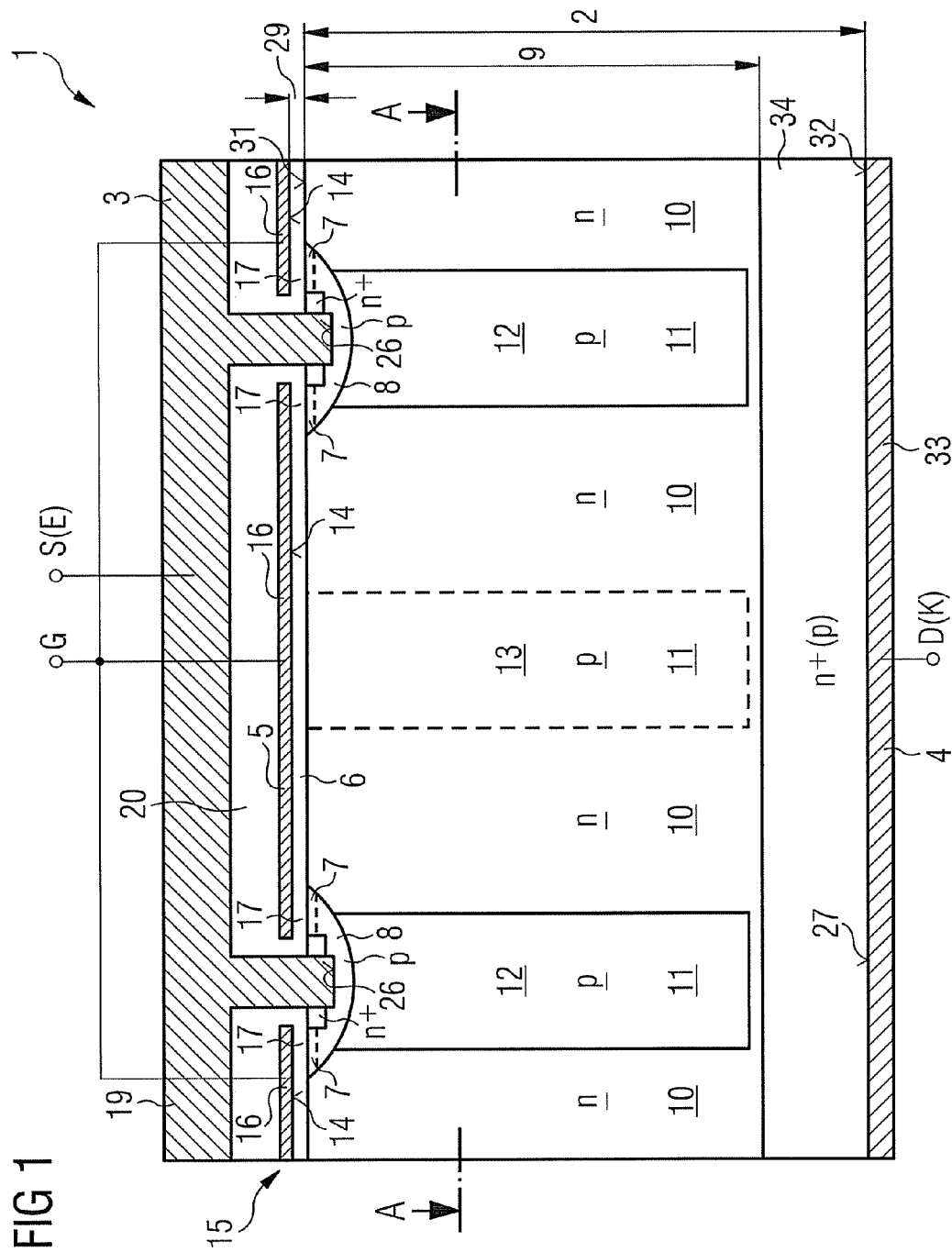

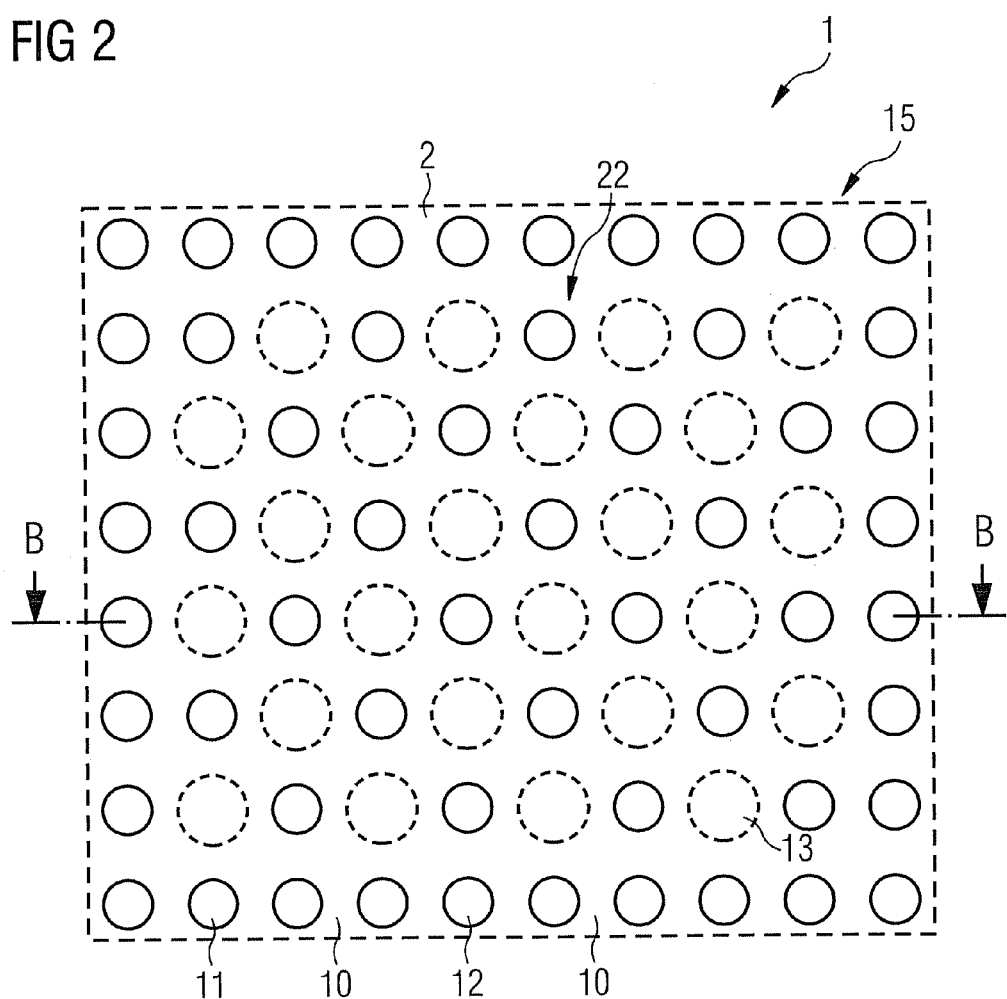

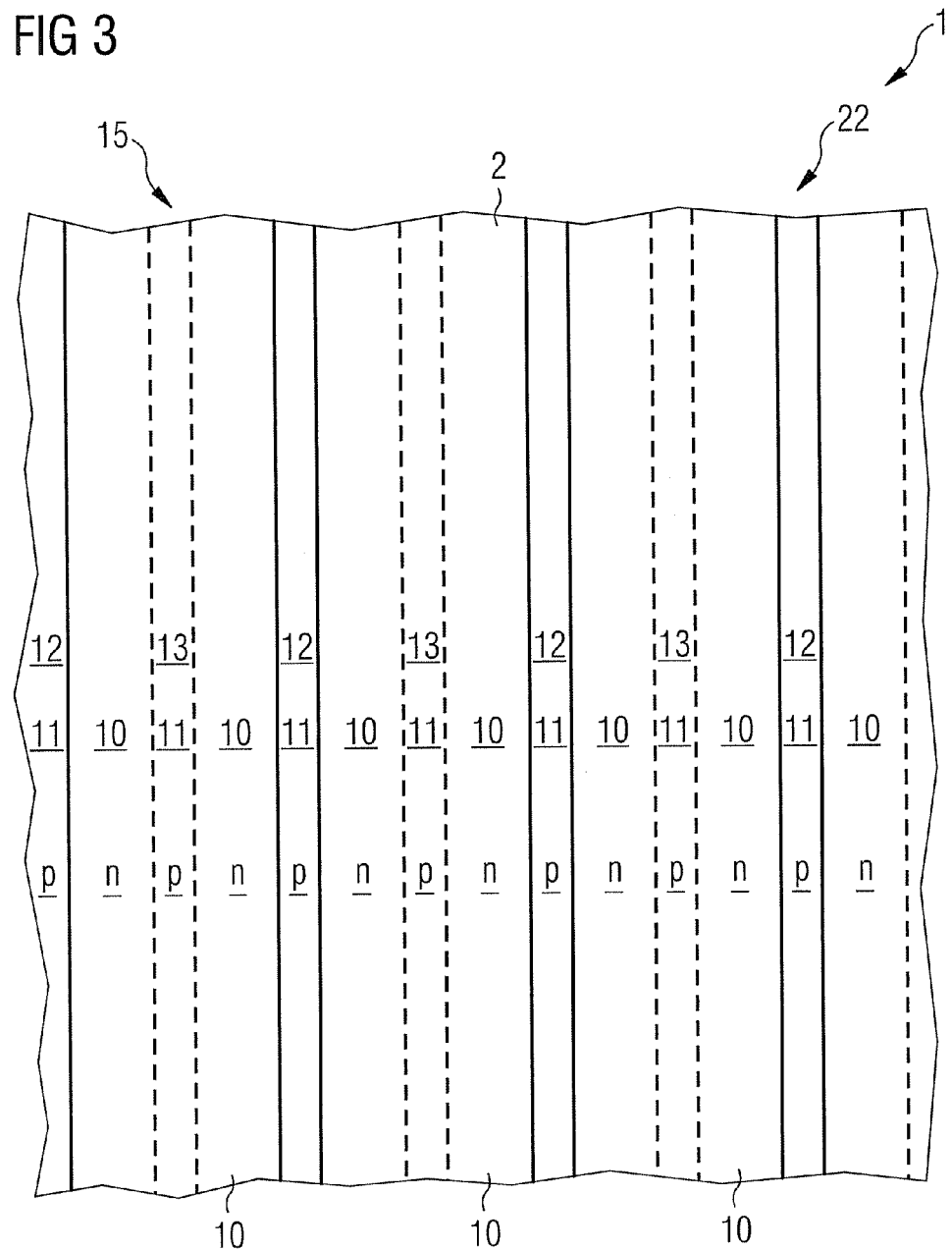

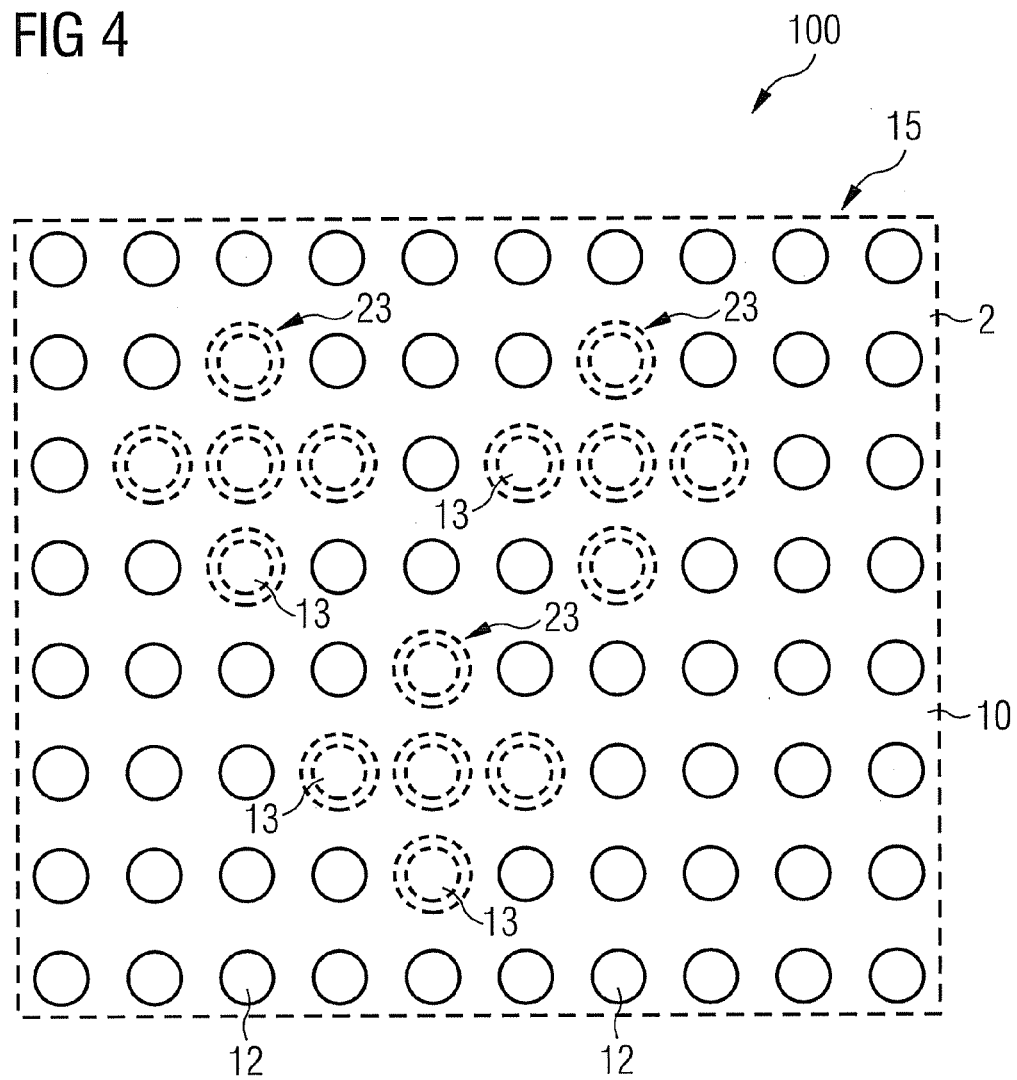

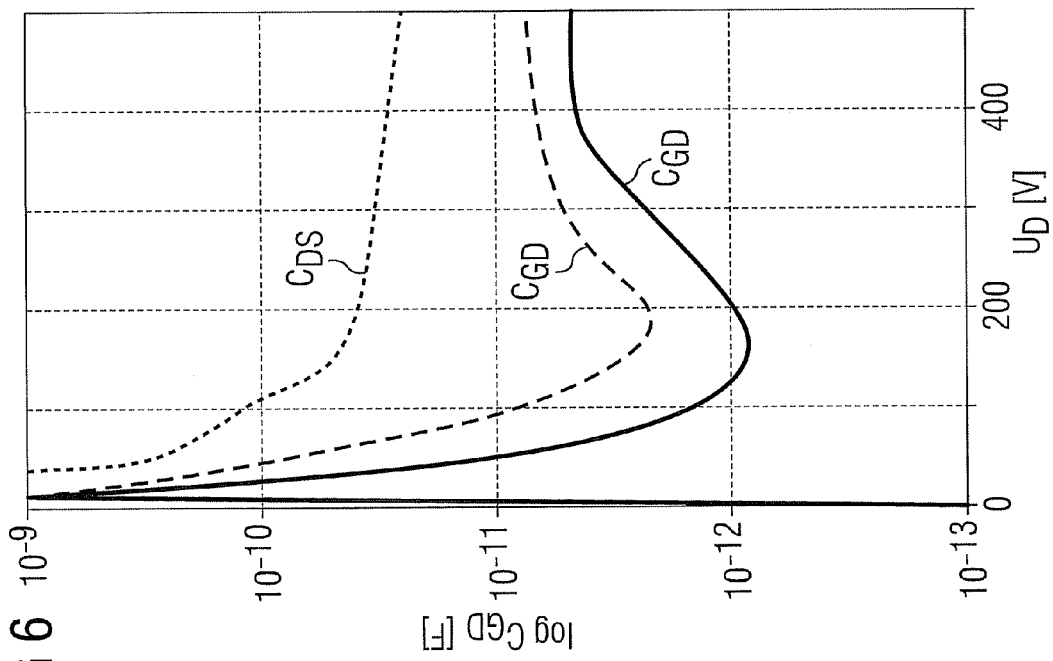
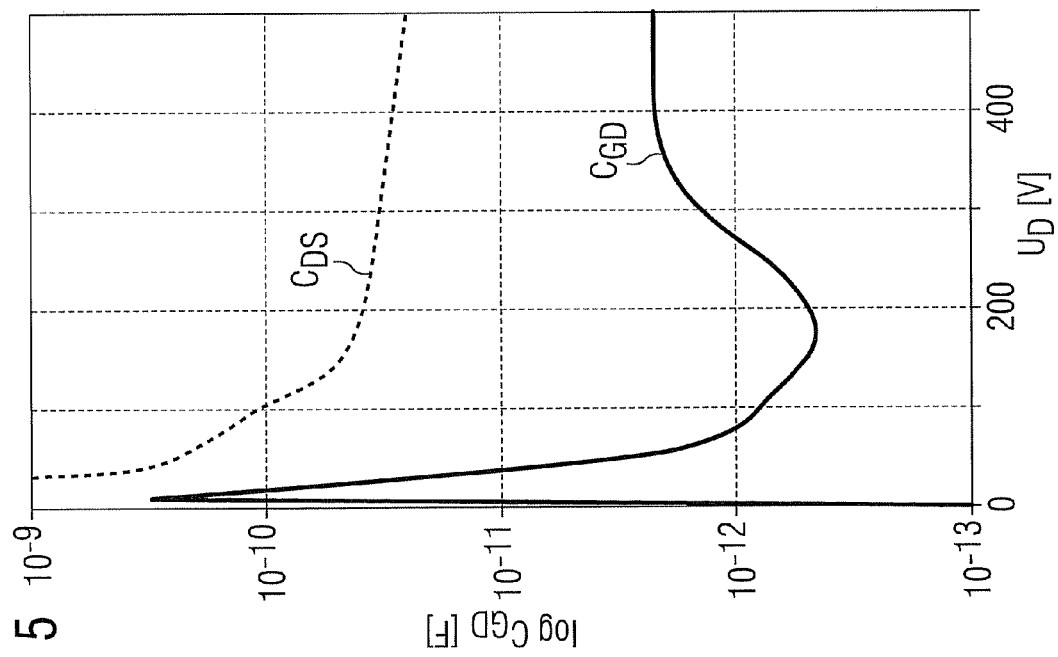

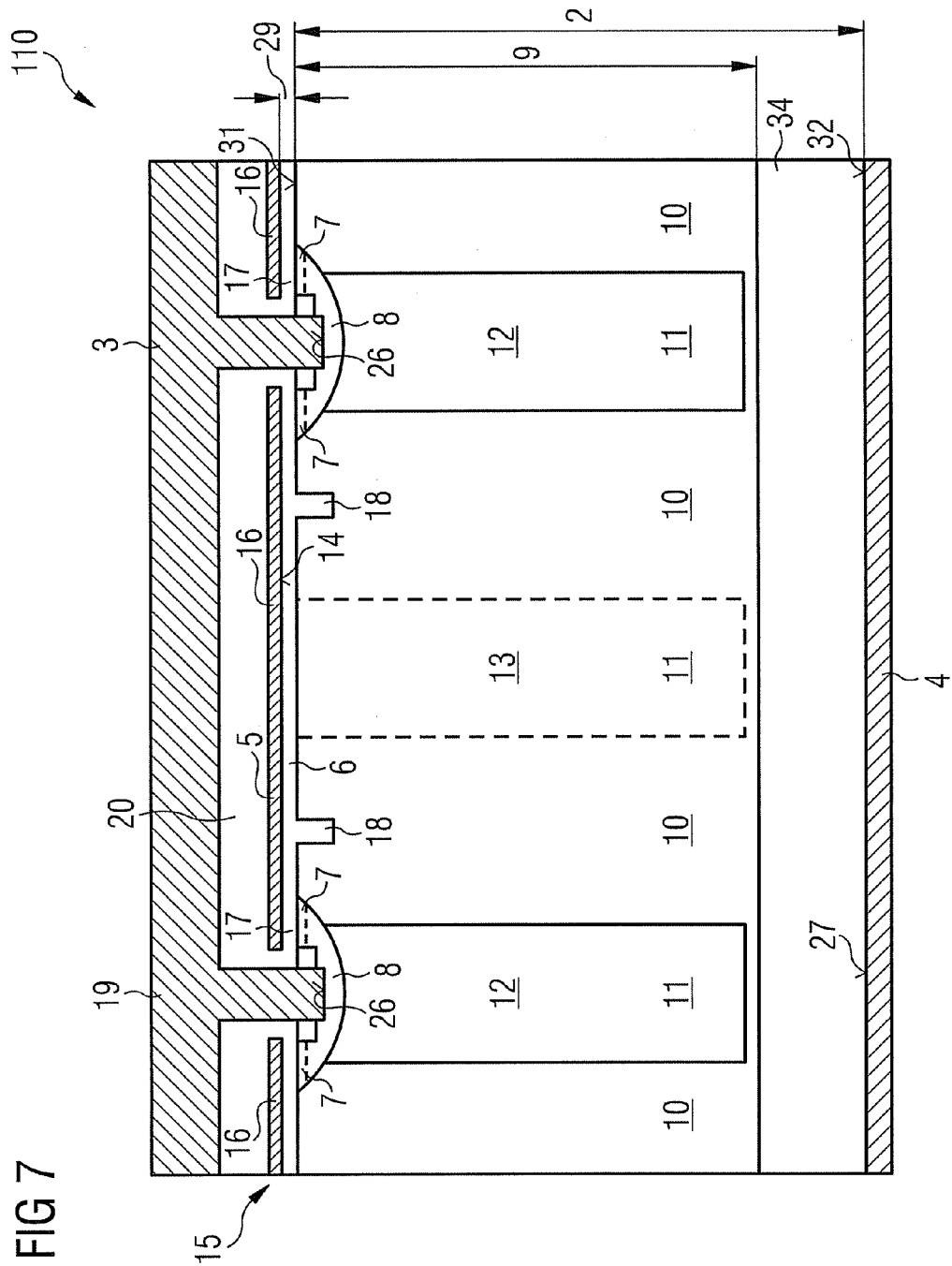

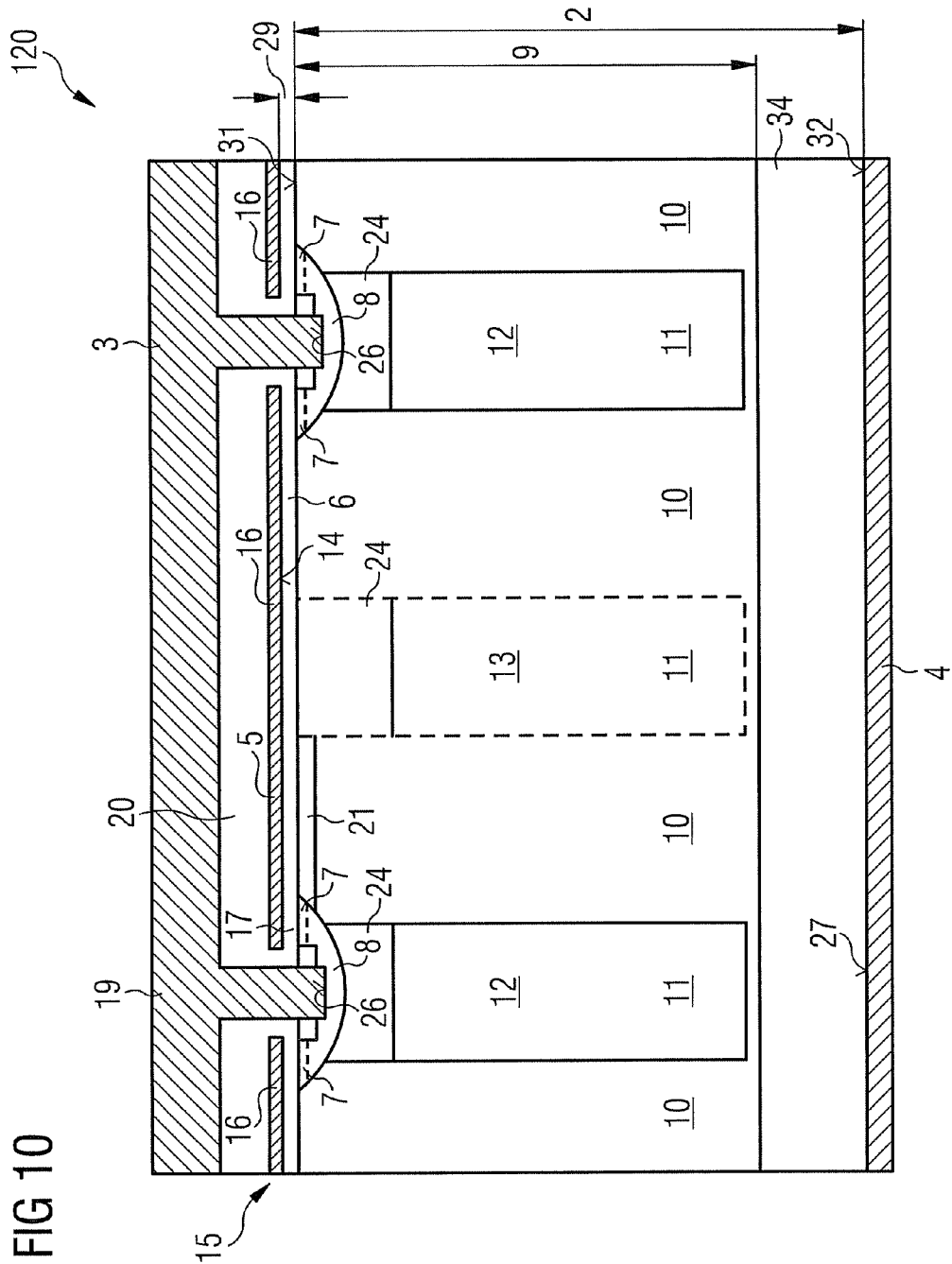

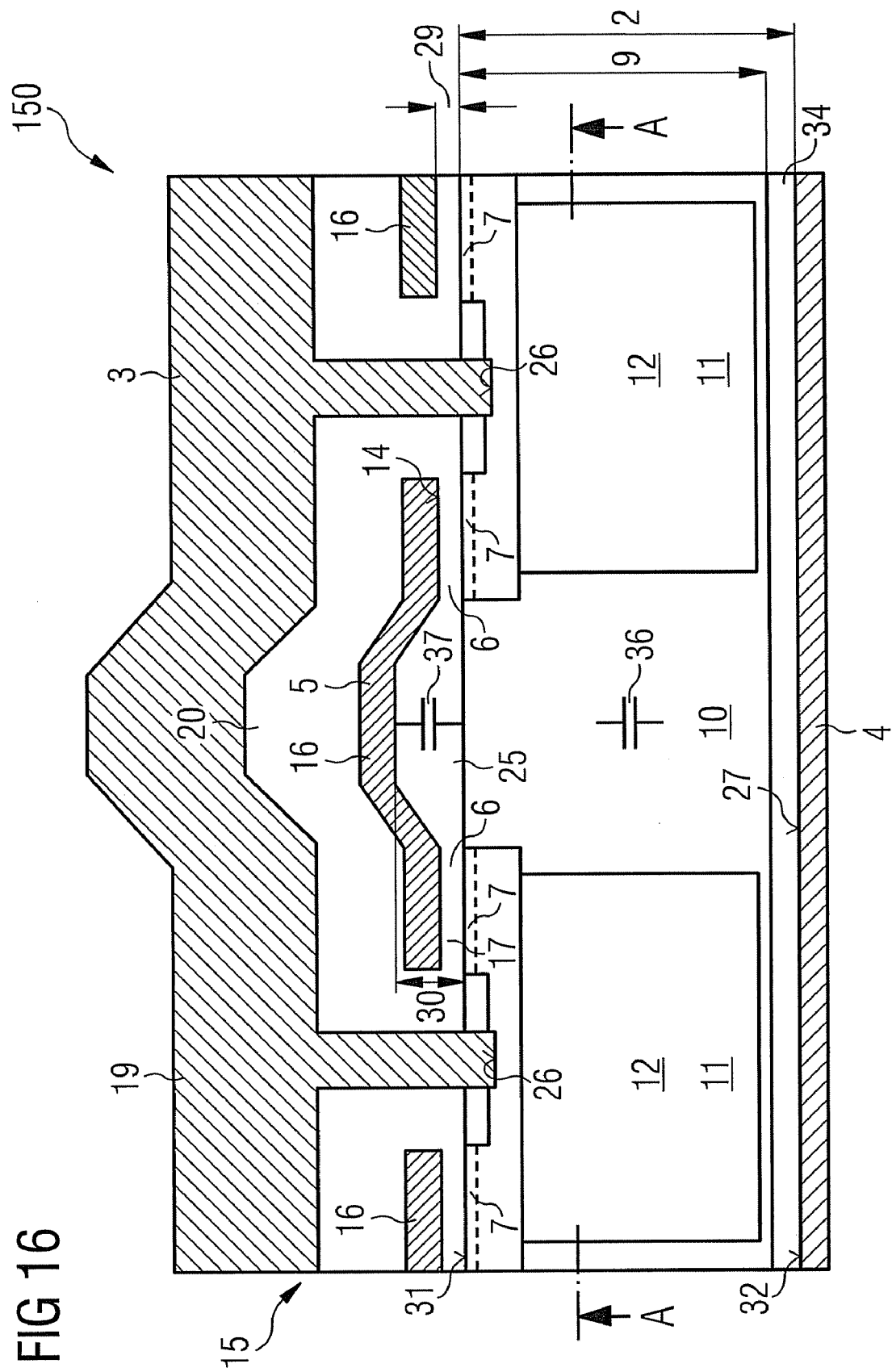

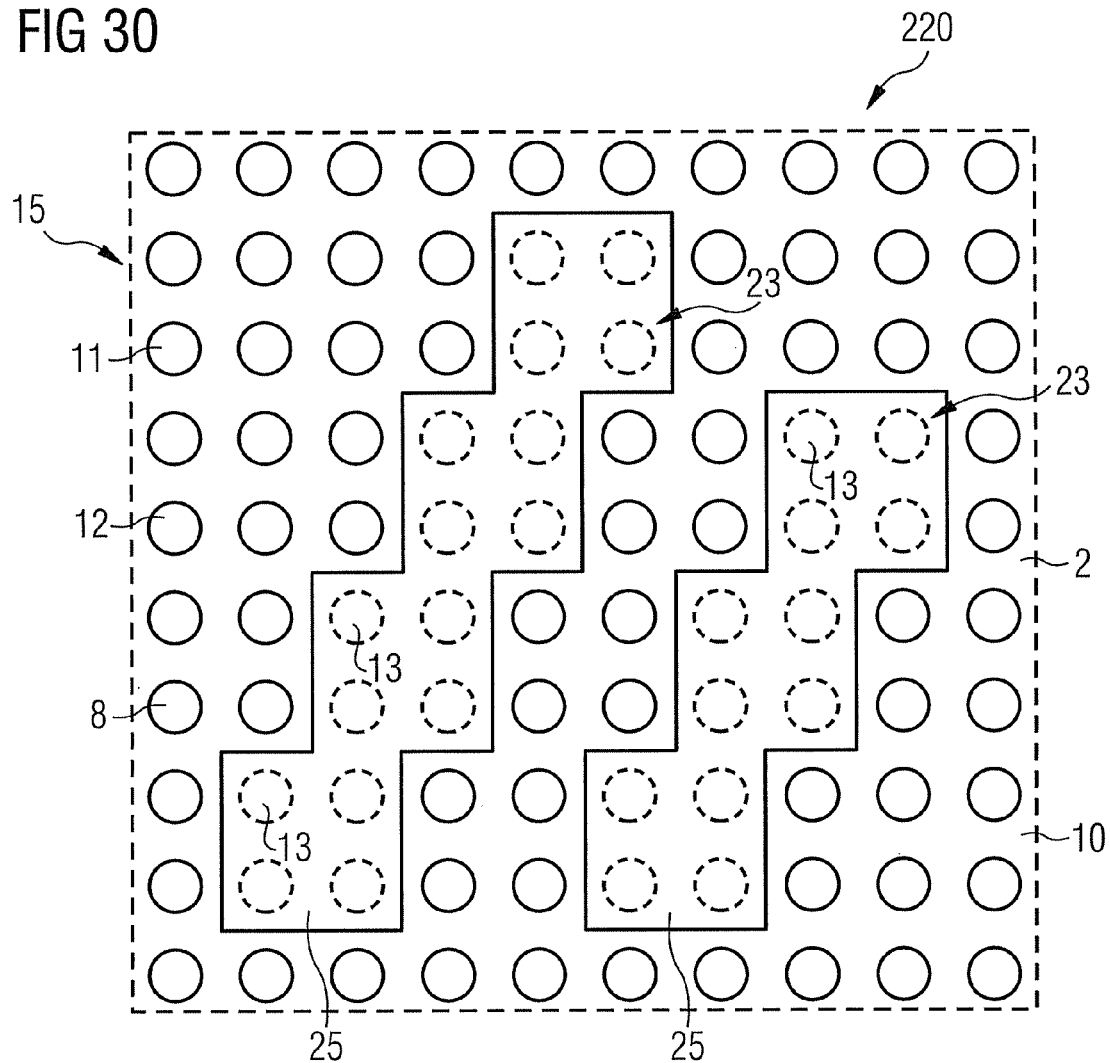

US 8,294,206 B2

INTEGRATED CIRCUIT DEVICE AND METHOD FOR ITS PRODUCTION

CROSS-REFERENCE TO RELATED APPLICATIONS

This application is a Divisional Application of U.S. patent application Ser. No. 11/963,057, entitled INTEGRATED CIRCUIT DEVICE AND METHOD FOR ITS PRODUCTION having a filing date of Dec. 21, 2007, and which is incorporated herein by reference.

BACKGROUND

Owing to their very low internal capacitance, present-day power semiconductor devices have an extremely high switching speed. This high switching speed is not always an advantage. Compensation devices, in particular, switch noticeably faster and more steeply than conventional MOSFET devices. In non-optimised applications, however, the very steep di/dt may in a shut-down process on parasitic inductances of the application circuit generate very high voltage peaks, which can destroy the semiconductor device. There is further a risk that vibrations may be caused in the shut-down process by the steep di/dt, which would affect the EMC (electromagnetic compatibility).

The di/dt can be limited by a larger switching resistor, which, however, slows down the overall switching process as an additional component. As a result, the advantage of fast switching and the reduced switching losses associated therewith can be lost completely or even reversed by the series-connected switching resistor, as the time constant resulting from the internal switching resistor and the internal capacitance between a control electrode of the semiconductor device and an output electrode is on the one hand increased by the series-connected additional switching resistor, thus attenuating or slowing down the switching process, while on the other hand switching losses increase noticeably as a result of the additional ohmic resistance.

SUMMARY

A semiconductor device includes a semiconductor body fitted with a first electrode and a second electrode on opposite surfaces. A control electrode on an insulating layer controls channel regions of body zones for a current flow between the two electrodes. A drift section adjoining the channel region includes drift zones and charge compensation zones. A part of the charge compensation zones includes conductively connected charge compensation zones electrically connected to the first electrode. Another part includes nearly-floating charge compensation zones, so that an increased control electrode surface has a monolithically integrated additional capacitance $C_{ZGD}$ in a cell region of the semiconductor device.

The gate-drain capacitance may be increased without requiring any additional chip area and without adding additional bond wires or new edges to the existing semiconductor device processes by the use of charge compensation regions which in part are not connected to the source potential, but terminate under a gatepoly layer. The feed-through of the semiconductor device is generally not affected by the presence of nearly-floating charge compensation zones.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 1 illustrates a diagrammatical vertical cross-section through a part of a semiconductor device according to an embodiment.

FIG. 2 illustrates a diagrammatic horizontal section of a cell region along intersecting plane A-A in FIG. 1.

FIG. 3 illustrates a diagrammatic vertical section of a cell region along intersecting plane B-B in FIG. 2.

FIG. 4 illustrates a diagrammatic horizontal section of a cell region of a semiconductor device according to a further embodiment.

FIG. 5 illustrates the behavior of the feedback capacitance $C_{GD}$ and the output capacitance $C_{DS}$.

FIG. 6 illustrates further graphs of the feedback capacitance $C_{GD}$ and the output capacitance $C_{DS}$.

FIG. 7 illustrates a diagrammatic cross-section through a part of a semiconductor device according to a further embodiment.

FIG. 10 illustrates a diagrammatic cross-section through a part of a semiconductor device according to a further embodiment.

FIG. 16 illustrates a diagrammatic cross-section through a part of a semiconductor device according to a further embodiment.

FIG. 30 illustrates a diagrammatic section through a cell region of a semiconductor device according to a further embodiment.

DETAILED DESCRIPTION

Figure 9:
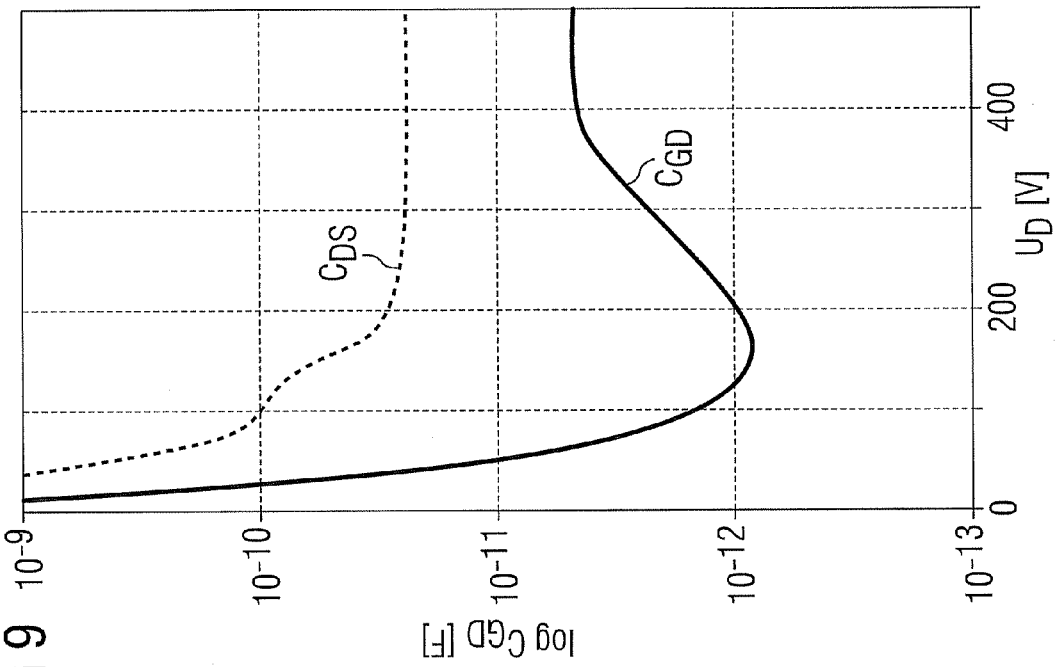
FIG. 9 illustrates the behavior of the feedback capacitance $C_{GD}$ and the output capacitance $C_{DS}$ of a MOSFET structure.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

FIG. 1 illustrates a diagrammatical cross-section through a part of an integrated circuit, or semiconductor device 1 according to an embodiment. The semiconductor device 1 includes a semiconductor body 2, which is provided on opposite surfaces with a first electrode 3 on its front side 31 and a second electrode 4 on its back side 32. A control electrode 5 on an insulating layer 6 with a typical thickness up to a few 10 nm controls channel regions 7 of body zones 8 in the semiconductor body 2 for a current flow between the two electrodes 3 and 4.

A drift section 9 adjoining the channel regions 7 includes drift zones 10 and charge compensation zones 11. A part of the charge compensation zones 11 is represented by conductively connected charge compensation zones 12 electrically connected to the first electrode 3 in this embodiment. Another part is represented by nearly-floating charge compensation zones 13.

The term "nearly-floating charge compensation zones 13" in this context denotes floating charge compensation zones 13 which are only capacitively coupled as well as charge compensation zones 13 which are connected, via monolithically integrated high-impedance bridges in the semiconductor body, to adjacent body zones 8 or to adjacent electrically connected charge compensation zones 12 contacted with low impedance by the first electrode 3 through suitable vias. Nearly-floating charge compensation zones 13 which do not terminate in a body zone are indicated by broken lines in FIG. 1. As a result, an additional poly surface connected to gate potential forms a monolithically integrated additional capacitance $C_{ZGD}$ in a cell region 15 of the semiconductor device 1.

The nearly-floating charge compensation zones 13 not terminating in a body zone therefore provide for an additional feedback capacitance $C_{ZGD}$ as a result of the increased poly surface connected to gate potential above an insulating layer 6. The insulating layer 6 between an enlarged control electrode 5 and the nearly-floating charge compensation zones 13, of which only one is illustrated in FIG. 1, represents the dielectric of the additional capacitance $C_{ZGD}$. Above the control electrode 5, there is an intermediate insulating layer 20, on which a metal layer 19 for the first electrode 3 is located, wherein there is no provision for a through-hole from the first electrode 3 to the nearly-floating charge compensation zones 13.

In the region of the nearly-floating charge compensation zones 13 on the front side 29 of the semiconductor body 2, this results in a sequence of layers including a structured dielectric layer 6 made of a gate oxide material 17. In the region of the enlarged control electrode 5 and the nearly-floating charge compensation zones 13, the dielectric layer 6 forms the dielectric for the additional capacitance. The structured highly conductive polysilicon layer 16 placed thereon includes a connecting zone 14 of the control electrode 5 while simultaneously acting as a capacitor plate of the additional capacitance. This is followed by a structured layer of intermediate oxide 20 and finally, as a cover for the semiconductor device regions, a metal layer 19 with connecting zones 26 of the first electrode 3, which in the present case represents a source electrode S of a MOSFET.

The individual connecting zones 14 in the cell region 15 of the control electrode 5 can be merged into a gate electrode G via the structured polysilicon layer. In addition, a metallization layer 33 on the back side 32 represents a drain electrode D in the vertical MOSFET of the illustrated embodiment. Between the metallization layer 33 on the back side 32 of the semiconductor body 2 and the drift section 9 of the semiconductor body 2, a substrate 34 may be provided which is doped more highly than the drift section 9 of the semiconductor body 2.

A simulated potential distribution in a avalanche situation shows that the nearly-floating charge compensation zones 13 without vias and connection to the first electrode 3 are, just as the other electrically connected charge compensation zones 12 with contact to the first electrode 3, depleted, so that there are no substantial differences in potential and field distribution. The only difference lies in the fact that the structure of this embodiment has a slightly more positive potential at the upper end than the structure wherein all charge compensation zones 11 are electrically coupled to the source electrode S. The electric field in the nearly-floating charge compensation zone 13 has to be designed such that an avalanche situation is completely excluded.

The simulation was further able to verify the influence of the structure of a semi-conductor device 1 according to the invention on the on resistance $R_{ON}$. The drift zones 10 adjacent to the nearly-floating charge compensation zones 13 are now no longer fed by two channels 7, but by only one channel 7 as illustrated in FIG. 1. As the on resistance $R_{ON}$ of a MOSFET is essentially determined by the length of the drift section 9 and the conductivity of the drift zones 10, the difference in the on resistance $R_{ON}$ between a MOSFET with electrically connected charge compensation zones 12 and a MOSFET according to the present embodiment is negligible. During the simulation, for example, an increase of approximately 1% in the on resistance $R_{ON}$ was detected in a switched-on device with a gate voltage of 10 V and an on-state voltage of 3 V.

Figure 11:
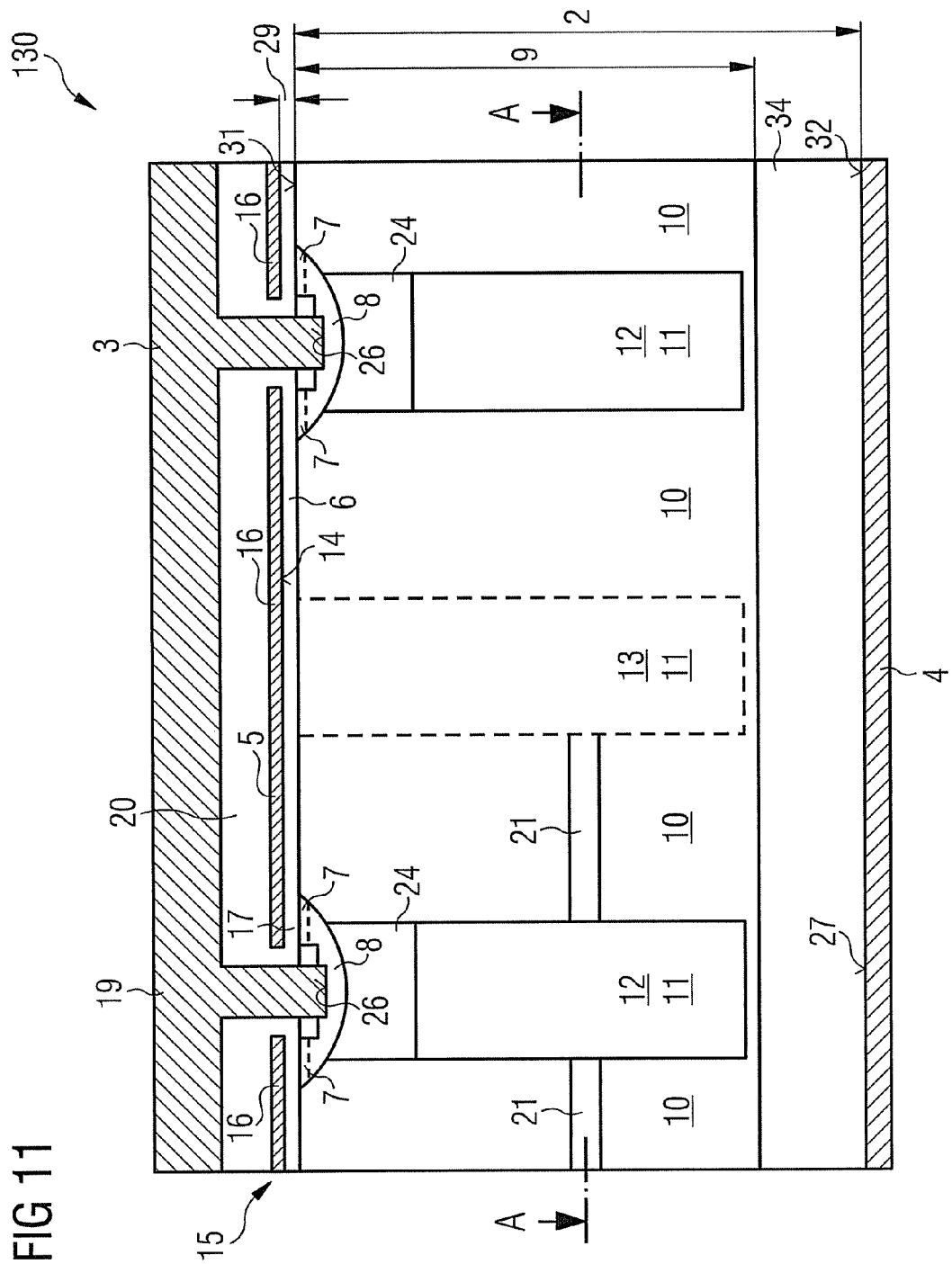
FIG. 11 illustrates a diagrammatic cross-section through a part of a semiconductor device according to a further embodiment.
Figure 12:
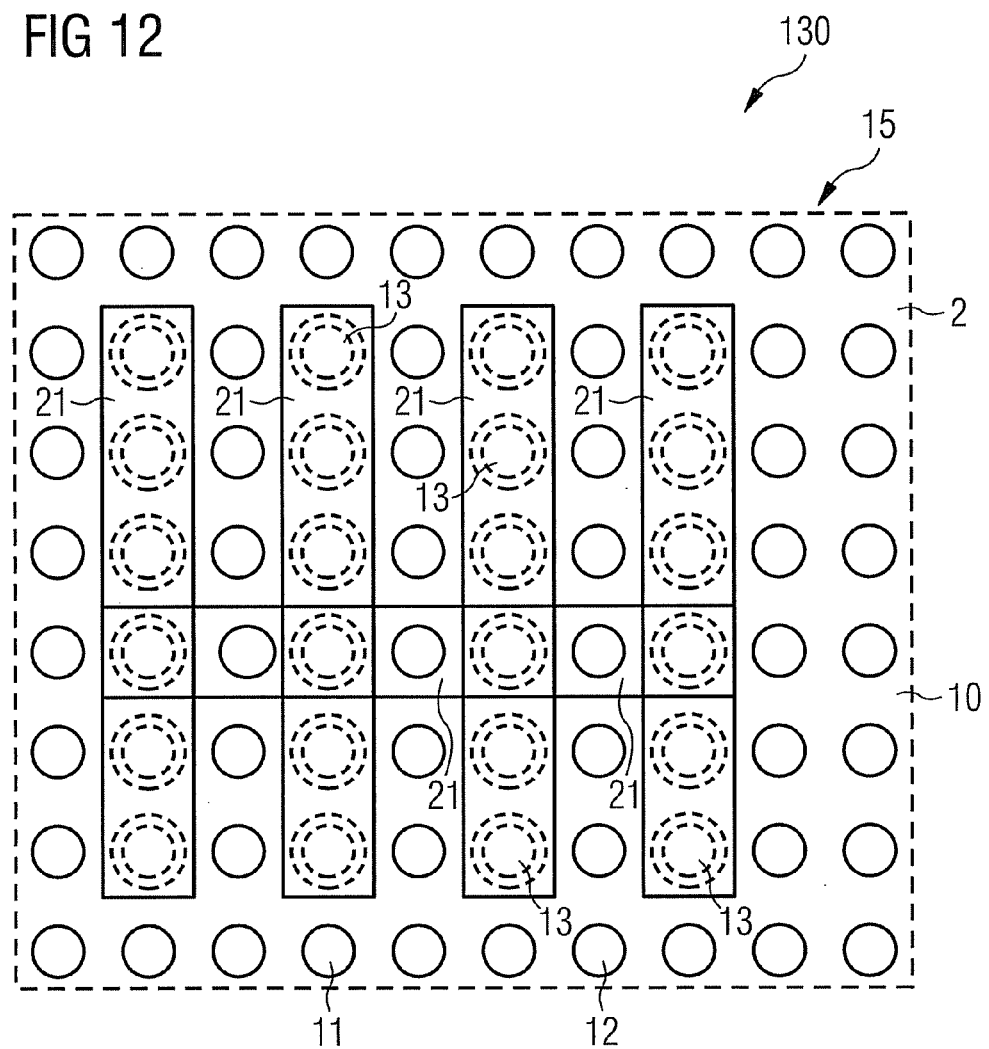
FIG. 12 illustrates a horizontal section of a cell region along intersecting plane A-A in FIG. 11.
Figure 13:
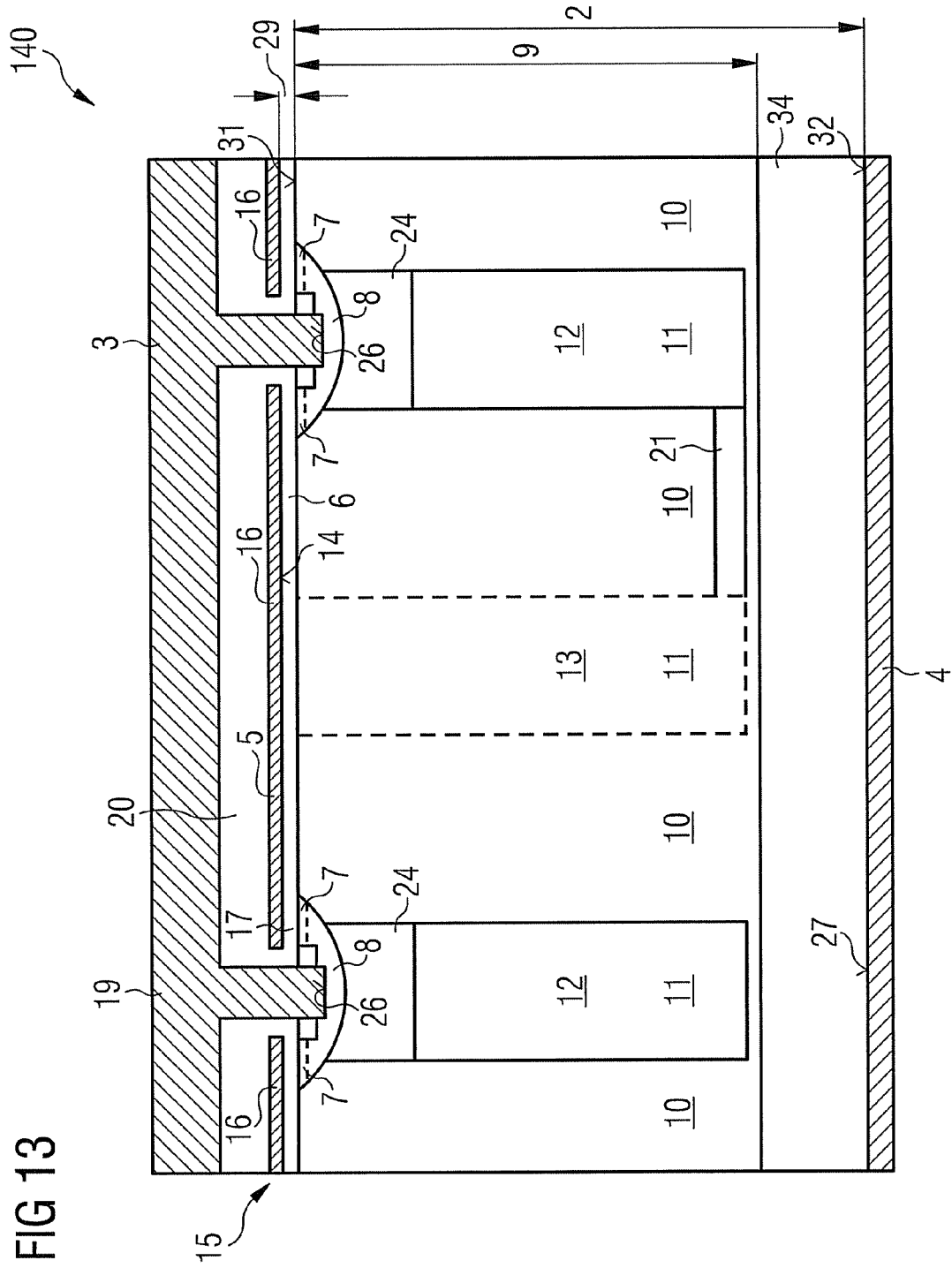
FIG. 13 illustrates a diagrammatic cross-section through a part of a semiconductor device according to a further embodiment.

When a high voltage is applied, the charge compensation zones 12 of the structure according to the present embodiment operate at negative potential. Although the drift zones 10 have a potential of a few volts at their upper ends directly below the control electrode 5, and although the upper end of the nearly-floating charge compensation zones 13 can also reach this potential, the capacitance between the charge compensation zones 13 and the control electrode 5 is only able to store a part of the displaced holes as the drift zones 10 are depleted. When the semiconductor device 1 is switched on, these stored holes are able to discharge the charge compensation zones 13, but not completely. This can be remedied by a high-impedance layer between a charge compensation zone 12 electrically connected to source and the nearly-floating charge compensation zone 13, as illustrated in FIGS. 11 to 13.

FIG. 2 illustrates a diagrammatic horizontal section of a cell region 15 along intersecting plane A-A in FIG. 1. The charge compensation zones 11 are p-type pillar in an n-type drift zone 10, wherein a part of the charge compensation zones 12 is conductively connected to the first electrode 3 in the form of a source electrode S via body zones 7 as illustrated by continuously drawn circles in the drawing, while the nearly-floating charge compensation zones 13 are indicated by circles drawn in broken lines.

In this cell region 15, a checker-board pattern 22 of the charge compensation zones 11 is illustrated, wherein nearly-floating charge compensation zones 13 alternate with electrically connected charge compensation zones 12 as on a checkerboard, but the cell field 15 is bounded by electrically connected charge compensation zones 12 in its edge region. The individually arranged nearly-floating charge compensation zones 13 have only a relatively small surface area at the upper end of the structure, which is able to accommodate and store the holes of the pillar-shaped charge compensation zones in the off-state.

FIG. 3 illustrates a diagrammatic vertical section through a cell region 15 along intersecting plane B-B in FIG. 2. The pillar-shaped nearly-floating charge compensation zones 13 are once again indicated by broken lines, while the electrically connected charge compensation zones 12 are indicated by continuous lines. The drift zones 10 located in between are n-doped, while the adjacent complementary charge compensation zones 11 are p-doped.

If, as illustrated in FIG. 4, several nearly-floating charge compensation zones 13 are merged, the ratio between a pillar charge and the available gate oxide surface becomes more favorable than in FIGS. 2 and 3. The complete pillar charge on the back side of the gate oxide can therefore be puffered more easily and involving a lower voltage increase.

A method for the production of a plurality of semiconductor chips includes the following: A semiconductor wafer is first structured from a semiconductor body 2 with semiconductor device structures in semiconductor chip positions. These semiconductor chip positions may include MOSFET and/or IGBT structures with connecting zones 26 of a first electrode 3 and connecting zones 27 of a second electrode 4. Between the two electrodes 3 and 4, a drift section 9 is located, the drift section 9 including drift zones 10 of a first conduction type and charge compensation zones 11 of a conduction type complementing the first conduction type.

A portion of the charge compensation zones 11 is arranged nearly-floating in a cell region 15. To a semiconductor body 2 of this structure, a structured dielectric layer 6 is applied, which insulates connecting zones 14 of a control electrode 5 via channel regions 7 of a body zone 8 and which partially extends across the nearly-floating charge compensation zones 13. A structured electrically conductive layer 16 is then applied to this dielectric layer 6, the electrically conductive layer 16 being made of a highly doped and therefore highly conductive polysilicon material.

The electrically conductive layer 16 forms the connecting zones 14 of the control electrode 5. The control electrode 5 and the nearly-floating charge compensation zones 13 act together to provide an additional capacitance $C_{ZGD}$ of the semiconductor device 1 within the cell region 15. This additional capacitance $C_{ZGD}$ supports the feedback capacitance $C_{GD}$ of the semiconductor device 1 and results in a softer switching behavior of the semiconductor device 1. The dielectric layer 6, which acts as the dielectric of the this additional capacitance $C_{ZGD}$ and is used as a gate oxide 17, can be produced by using thermal oxidation of the semiconductor material.

In the region of the nearly-floating charge compensation zones 13, a succession of layers is applied to the front side 31 of the semiconductor body 2; this includes the dielectric layer 6, the electrically conductive layer 16, an intermediate insulating layer 20 and finally a metal layer 19. The intermediate insulating layer 20 can be produced by using the application of silicon oxide or silicon nitride.

FIG. 4 illustrates a diagrammatic horizontal section of a cell region 15 of a semiconductor device 100 according to a further embodiment. In this further embodiment the cell region 15 of the semiconductor device 100 includes nearly-floating charge compensation zones 13 arranged in contiguous groups 23, which are once again indicated by circles drawn in broken lines and are surrounded by electrically connected charge compensation zones 12. Compared to the checkerboard pattern illustrated in FIG. 2, the ratio of the numbers of nearly-floating charge compensation zones 13 and of electrically connected charge compensation zones 12 is lower. This further reduces the minimum difference from prior art in regard to the on resistance $R_{ON}$, because a greater number of charge compensation zones 11 is conductively connected. This reduction of the number of nearly-floating charge compensation zones 13 becomes possible if the nearly-floating charge compensation zones 13 are not made to extend completely to the front side 31 of the semiconductor body 2. The following diagrams illustrate the effect of the embodiments on the feedback capacitance $C_{GD}$.

FIG. 5 illustrates the behavior of the feedback capacitance $C_{GD}$ and the output capacitance $C_{DS}$ of a MOSFET structure with electrically connected charge compensation zones in the field region. In the reference configuration on which this diagram is based, all charge compensation zones of the field region are conductively connected to the source potential via the body zone. FIG. 5 plots the drain voltage $U_D$ in volts on the abscissa and indicates the feedback capacitance $C_{GD}$ by the continuous line and the output capacitance $C_{DS}$ by the dotted line. On the ordinate, capacitance values are given in Fahrenheit in the logarithmic scale. Both capacitance curves are therefore voltage-dependent, the feedback capacitance $C_{GD}$ having minimum values in the range of 0.5 pF.

FIG. 6 illustrates further curves of the feedback capacitance $C_{GD}$ and the output capacitance $C_{DS}$ in variously active nearly-floating charge compensation zones. While the behavior of the output capacitance $C_{DS}$ in dependence on output voltage $Q_D$ remains virtually unchanged, the curve illustrated for the feedback capacitance $C_{GD}$ as illustrated in FIG. 5 is displaced towards considerably higher capacitance values. The minimum value is approximately 0.9 pF, if the nearly-floating charge compensation zones include highly doped near-surface regions, and can be increased further to values of almost 3 pF, if nearly-floating charge compensation zones without highly doped near-surface regions are provided, as indicated by the broken line. Efficiency is improved further if a near-surface trench structure with a depth of a few micrometers is arranged around the nearly-floating charge compensation zones 13, as illustrated in FIG. 7.

FIG. 7 illustrates a diagrammatic cross-section through a part of a semiconductor device 110 according to a further embodiment. Components of the same function as those illustrated in the preceding figures are identified by the same reference numbers and not explained again.

This embodiment differs from the semiconductor device 1 illustrated in FIG. 1 in that the nearly-floating charge compensation zones 13 are surrounded by a trench 18 with a depth of approximately 1 μm, which is filled with a dielectric. This trench, which is also referred to as oxide trench, prevents the draining of holes. As a result, the potential at this point increases in the off-state, for example, at an avalanche voltage of 730 V, from the 4 V referred to above to approximately 40 V. This effectively prevents an avalanche situation in the nearly-floating charge compensation zones 13, while on the other hand the oxide or the dielectric layer 6 is highly loaded towards the control electrode 5. However, the number of the holes now stored is sufficient to discharge the nearly-floating charge compensation zones 13 completely when the structure is switched on.

Figure 8:
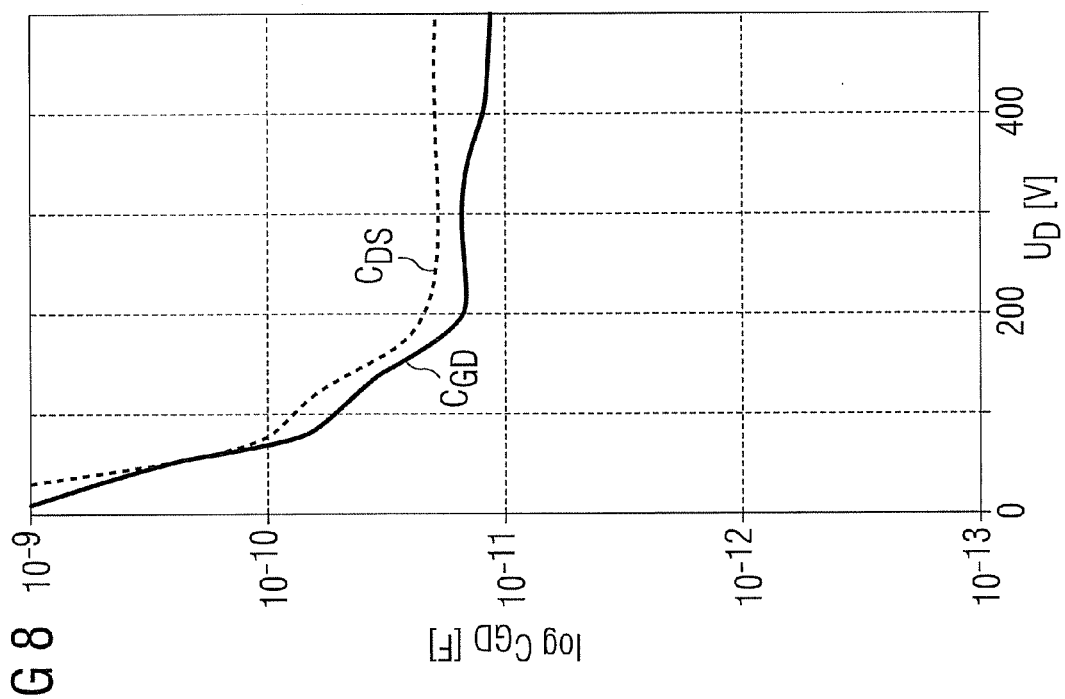
FIG. 8 illustrates the behavior of the feedback capacitance $C_{GD}$ and the output capacitance $C_{DS}$ of a semiconductor device of an embodiment according to FIG. 7.

FIG. 8 illustrates the behavior of the feedback capacitance $C_{GD}$ and the output capacitance $C_{DS}$ of a semiconductor device of an embodiment according to FIG. 7. In the diagram of FIG. 8, the feedback capacitance $C_{GD}$ is once again indicated by a continuous line. Compared to the case illustrated in FIG. 9 with nearly-floating charge compensation zones and highly doped near-surface regions of the said nearly-floating charge compensation zones, a significant increase in the feedback capacitance $C_{GD}$ is once again obtained.

This diagram illustrates clearly that the feedback capacitance $C_{GD}$ is significantly increased by the storage of the holes. For braking the semiconductor device 110 according to FIG. 7 in the switching process, just a few nearly-floating charge compensation zones per semiconductor chip would be sufficient, which in turn further reduces the effect of this modification according to the invention on the on resistance $R_{ON}$. This means that the number of nearly-floating charge compensation zones can be reduced further compared to the conductively connected charge compensation zones in the semiconductor device or in the cell region of the semiconductor device.

FIG. 9 illustrates the behavior of the feedback capacitance $C_{GD}$ and the output capacitance $C_{DS}$ in semiconductor devices wherein, although nearly-floating charge compensation zones are provided, these nearly-floating charge compensation zones are not surrounded by trenches filled with a dielectric for the storage of holes.

FIG. 10 illustrates a diagrammatic cross-section through a part of a semiconductor device 120 according to a further embodiment. Components of the same function as those illustrated in the preceding figures are identified by the same reference numbers and not explained again.

This semiconductor device 120 differs from the semiconductor devices described above in that a high-impedance connecting layer 21 is provided, which provides for a high-impedance bridge for connecting the nearly-floating charge compensation zones 13 to a body zone 8 illustrated in the drawing near the surface of the semiconductor body 2. In the actual switch-on process, this high-impedance layer 21 prevents the dropping of the nearly-floating charge compensation zones 13 of the structure according to the invention to a low negative potential.

This diagram further illustrates that the near-surface regions 24 of the charge compensation zones can be terminated with a relatively high complementary doping. On the other hand, it is possible to leave the charge compensation zones 11, in particular the nearly-floating charge compensation zones 13, without a highly-doped termination, so that these are solely represented by the implanted base regions 39. Technologically this is even, being the simpler solution, because it does not involve any additional photographic technology. In the lithographic process for the electrode 16, the region above the nearly-floating pillar is not opened up, so that the structures develop automatically as in the case of the preceding embodiments.

As the following figures illustrate, however, in further embodiments to install the high-impedance layer 21 near the surface may be omitted.

FIG. 11 illustrates a diagrammatic cross-section through a part of a semiconductor device 130 according to a further embodiment. This embodiment differs from the preceding variants in that a high-impedance, complementary-type layer 21 is located within the semiconductor body 2 between the nearly-floating charge compensation zones 13 and the conductively connected charge compensation zones 12. The two-dimensional structure of this high-impedance bridge in the form of a high-impedance layer 21 can be chosen as desired. FIG. 12 illustrates an embodiment.

FIG. 12 illustrates a horizontal section of a cell region 15 along intersecting plane A-A in FIG. 11. The semiconductor body 2 includes high-impedance layers 21, which connect all of the nearly-floating charge compensation zones 13 to one another, the nearly-floating charge compensation zones 13 being, by using an interconnection with a high-impedance layer 21, connected with high impedance to conductively connected charge compensation zones 12, thus implementing the advantages of this embodiment as described above.

FIG. 13 illustrates a diagrammatic cross-section through a part of a semiconductor device 140 according to a further embodiment. This embodiment differs from the preceding embodiment in that a high-impedance bridge in form of a high-impedance layer 21 with complementary doping is provided in the base region of the nearly-floating charge compensation zones 13 to provide a bridge to a conductively connected charge compensation zone 12 in the interior of the semiconductor body 2.

The deceleration of the semiconductor device due to its higher feedback capacitance also increases its input capacitance $C_{iss}$, which is made up of the gate-drain capacitance $C_{GD}$ and the gate-source capacitance $C_{GS}$. This relationship is illustrated by the next two figures.

Figure 14:
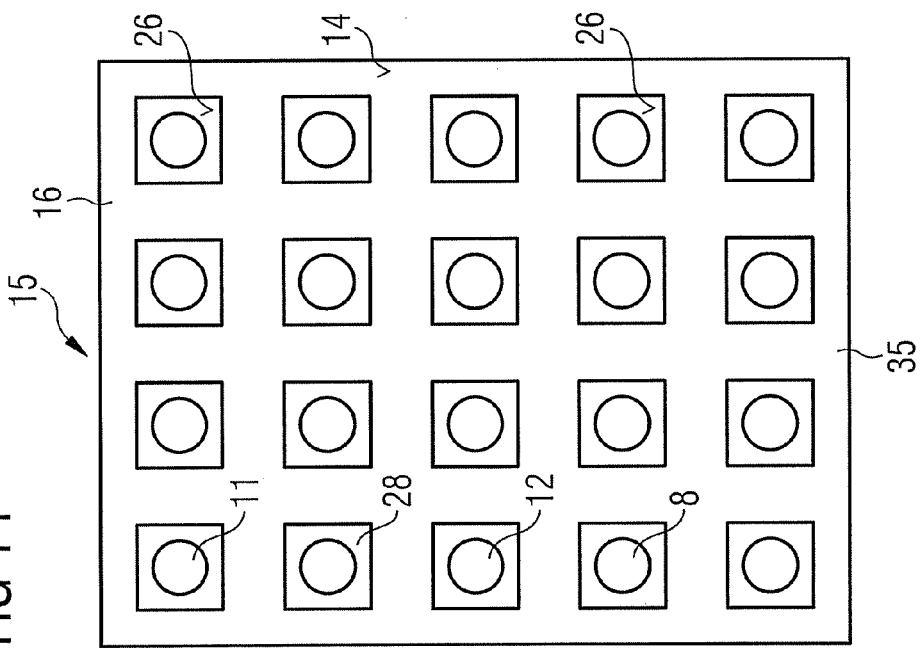
FIG. 14 illustrates a diagrammatic top view of a structure with a relatively large surface area of a polysilicon layer.

FIG. 14 illustrates a diagrammatic top view of a structure with a relatively large surface area of a polysilicon layer 35 for gate electrodes, wherein the polysilicon layer 35 forms a connecting zone 14 of the control electrode, which is interspersed with rectangular vias 28. Conductively connected charge compensation zones 12 in the form of pillars are located below the vias 28. These pillars are surrounded by an n-type material of the drift zone. Owing to the large polysilicon surface area, a high gate charge develops at the same time and has to be dissipated when the semiconductor device is switched off, with the result that a high gate charge causes a long switching delay when the semiconductor device is switched off.

A high gate charge therefore places a load on the driver without having a beneficial effect on the switching ramps of the semiconductor device. Although FIG. 14 illustrates that the large poly surface makes a noticeably softer switching behavior possible, it also results in a relatively high gate charge. If the vias 28 are enlarged, the polysilicon surface becomes smaller, thus reducing the feedback capacitance $C_{GD}$.

Figure 15:
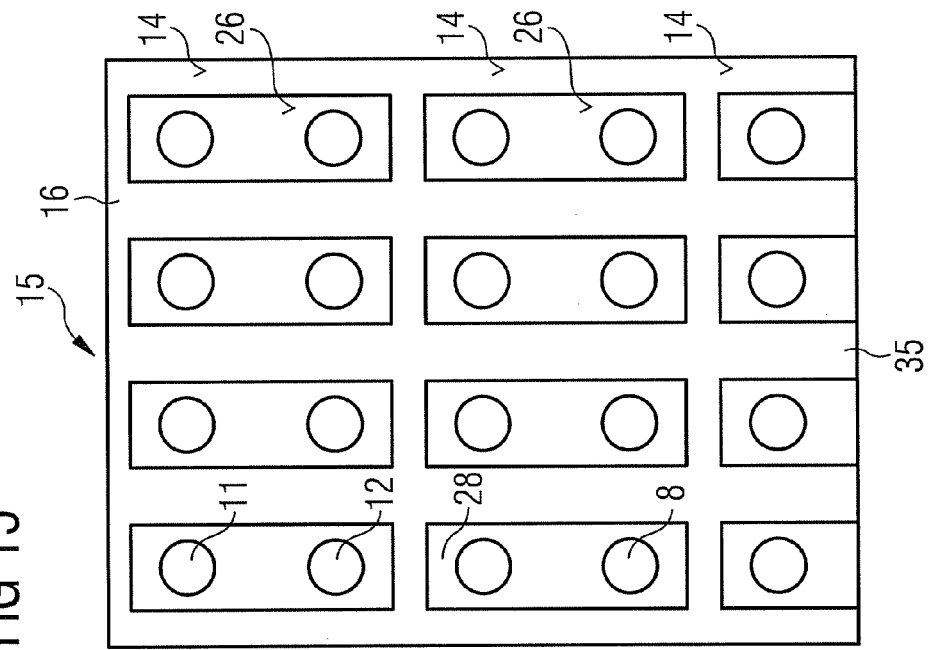
FIG. 15 illustrates a diagrammatic top view of a structure with a surface area of a polysilicon layer which has been reduced relative to FIG. 14.

FIG. 15 illustrates a diagrammatic top view of a structure with a surface area of a polysilicon layer 35 for the contact region of the control electrode or the gate electrodes which has been reduced relative to FIG. 14. Each of the vias 28 extends across two charge compensation zones, whereby the surface area of the polysilicon layer is reduced and, owing to the proportionality of the surface areas, the feedback capacitance $C_{GD}$ is likewise reduced, which may, however, result in a correspondingly "rough" switching behavior of the semiconductor device.

The gate charge, on the other hand, is significantly reduced in the embodiment according to FIG. 15, which benefits the switching behavior of the semiconductor device. In order to utilise nevertheless the advantages of an enlarged polysilicon surface as illustrated in FIG. 14 and to avoid the disadvantages of an increased gate charge, FIG. 16 illustrates further semiconductor device 150. With a virtually unchanged high feedback capacitance $C_{GD}$, which slows the switch-on behavior of the semiconductor device, this semiconductor device 150 avoids a "rough switching behavior" by providing a thicker dielectric layer 25 in the region of the drift zone, which is thicker than the gate oxide 17 in the channel region 7 of the body zone 2.

With the structure of a semiconductor device 150 according to a further embodiment as illustrated in FIG. 16, it is possible to obtain a high feedback capacitance $C_{GD}$ at the end of the Miller phase, i.e. in the switch-off process, because this part of the feedback capacitance $C_{GD}$ determines the time response du/dt. Before this point, however the feedback capacitance $C_{GD}$ should be as low as possible, as the gate charge places a load on the driver without any beneficial effect on the switching ramps.

As FIG. 16 illustrates, the feedback capacitance $C_{GD}$ is made up of a series-connection of a capacitance 36 determined by the space charge region and a capacitance 37 depending on the thicker insulating layer 25. As in series-connected arrangements the lower capacitance—in the present case the capacitance 36 of the space charge region—is the critical factor, the feedback capacitance $C_{GD}$ is hardly affected by the additional thickness of the oxide or insulating layer in the insulating region 25. The feedback capacitance $C_{GD}$ remains virtually unchanged by any thickening of the insulating layer 25 at the point indicated in FIG. 16. The result is a lower gate charge.

The gate charge is largely determined by a phase between $U_{GS}=U_{TH}$ (gate-source voltage=threshold voltage) and $U_{GS}=10$ V (operating voltage at the control electrode or the gate). In this phase there is accumulation on the surface 31 of the semiconductor body. The capacitance is therefore calculated from the poly surface area of the electrically conductive layer 16 and the oxide thickness 30. An increase in the oxide thickness 30 to a significant proportion of the surface area of the electrically conductive layer 16 results in a significant reduction of this capacitance and thus of the gate charge. This effect is illustrated in FIG. 17.

Figure 17:
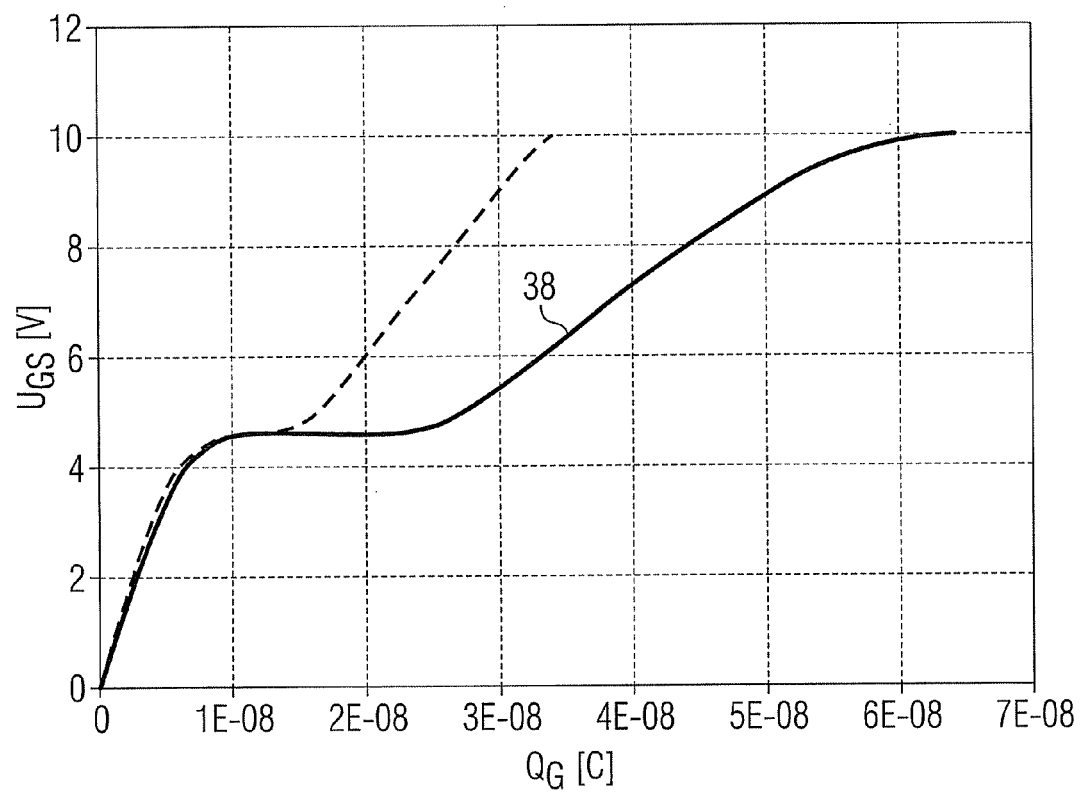
FIG. 17 illustrates a diagrammatic view illustrating the behavior of the gate charge $Q_G$.

FIG. 17 illustrates the behavior of the gate charge $Q_G$ with and without a thicker oxide layer above the drift zone of a semiconductor device. The broken line represents the gate charge for a structure with a thicker oxide layer. The continuous line with a noticeable Miller plateau represents the gate charge with an oxide layer above the drift zone or the nearly-floating charge compensation zones of the later embodiments which is less thick, as provided for the channel regions of the body zones.

Figure 18:
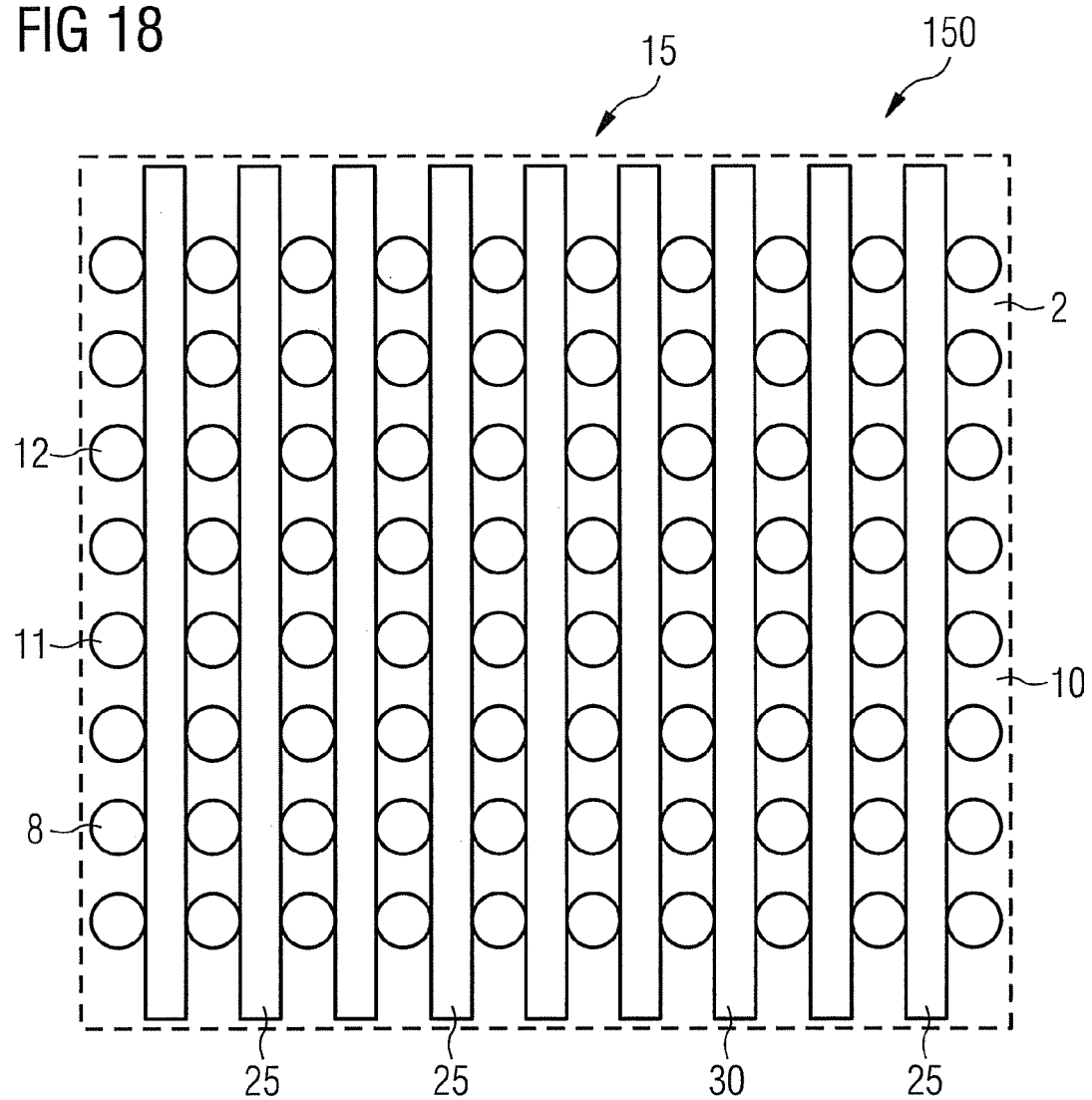
FIG. 18 illustrates a diagrammatic horizontal arrangement of a cell region in an embodiment according to FIG. 16.

FIG. 18 illustrates a diagrammatic horizontal arrangement of a cell region 15 with charge compensation zones 11 in an embodiment according to FIG. 16. Owing to the greater oxide thickness 30, the regions are arranged in strips above the drift zone 10 between the charge compensation zones 12 and cause the gate charge to remain low. In principle, completely different structures can be used for the greater oxide thickness 30 of the insulating material between the electrically conducting layer connected to gate potential and the drift zone 10 located below with the nearly-floating charge compensation zones not illustrated in FIG. 18.

Figure 19:
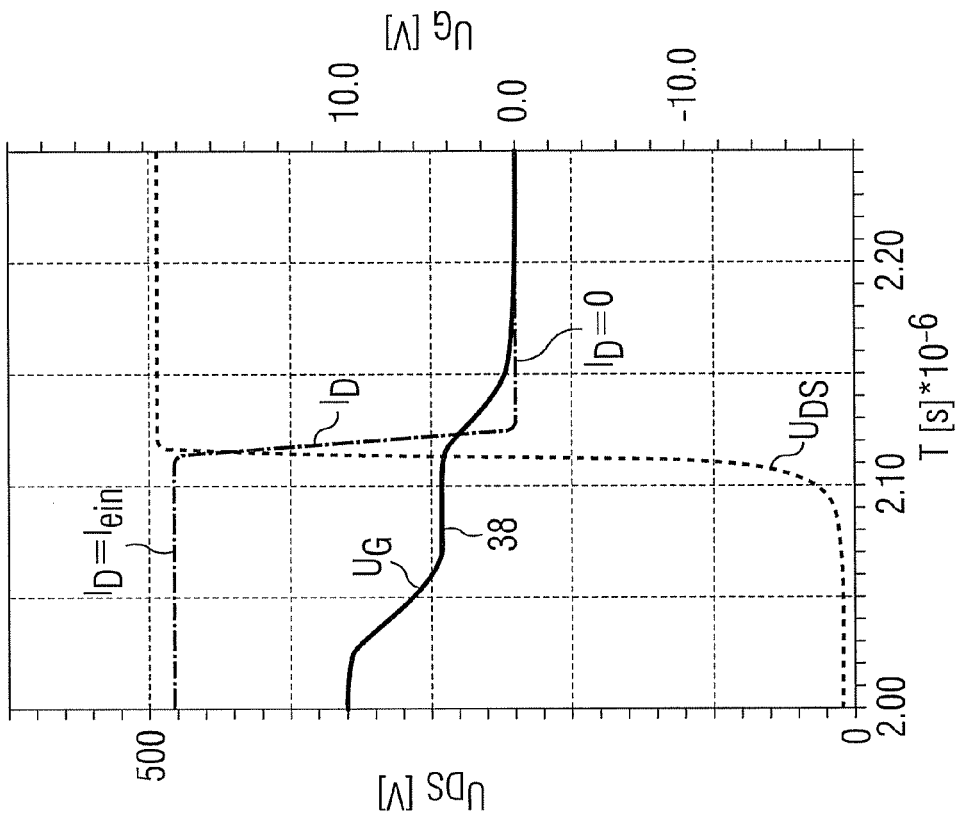
FIG. 19 illustrates a diagrammatic view of the shut-down behavior of a MOSFET.

FIG. 19 illustrates a diagrammatic view of the shut-down behavior of a MOSFET without a greater thickness of the insulating layer in the region of the drift zones. The continuous line represents the behavior of the gate voltage $U_G$ during the shut-down process.

The dotted line illustrates the increase in the gate-source voltage at the end of the Miller plateau 38 following the lowering of the gate charge. The dot-dash line finally illustrates the behavior of the drain current $I_D$, first in the on-state and then its reduction to 0 after a delay time.

Figure 20:
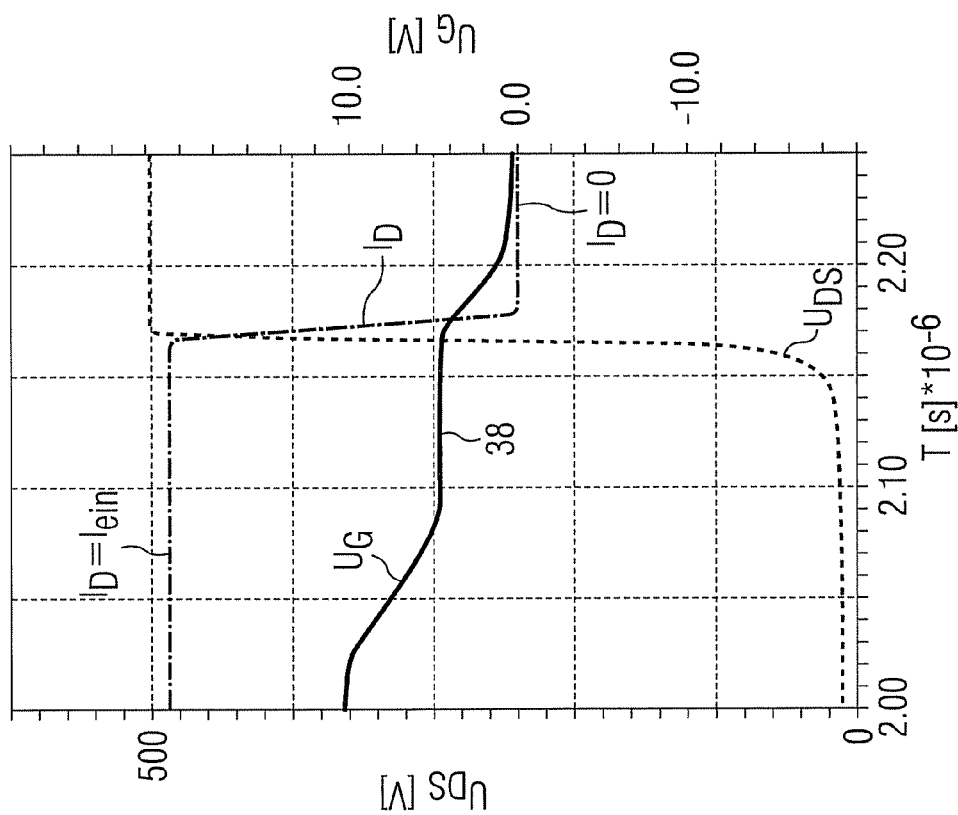
FIG. 20 illustrates a diagrammatic view of the shut-down behavior of a semiconductor device according to FIG. 16.

FIG. 20 illustrates a diagrammatic view of the shut-down behavior of a semiconductor device according to FIG. 16, the semiconductor device now having a lower gate charge as a result of the greater layer thickness above the drift zone. The delay time in the shut-down process is noticeably shortened, and the Miller plateau 38 is shorter as well, whereby a noticeably shortened storage time of the structure according to the invention is achieved in the shut-down process of the semiconductor device.

Figure 22:
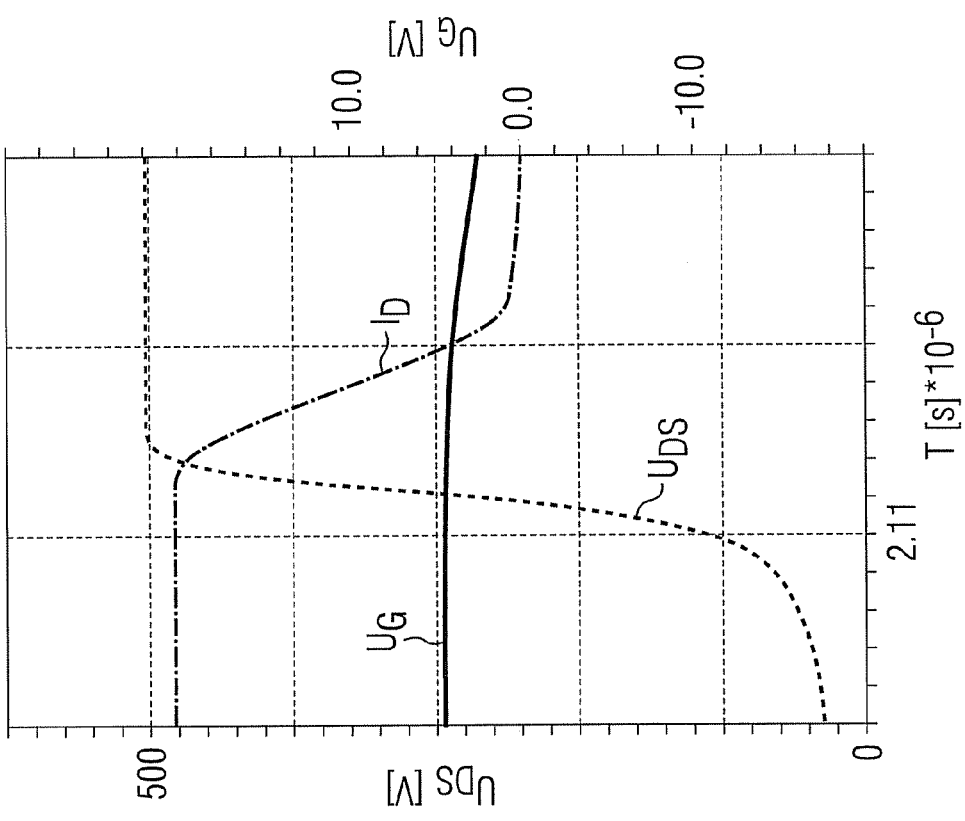
FIG. 22 illustrates an enlarged section of the diagram according to FIG. 21.
Figure 21:
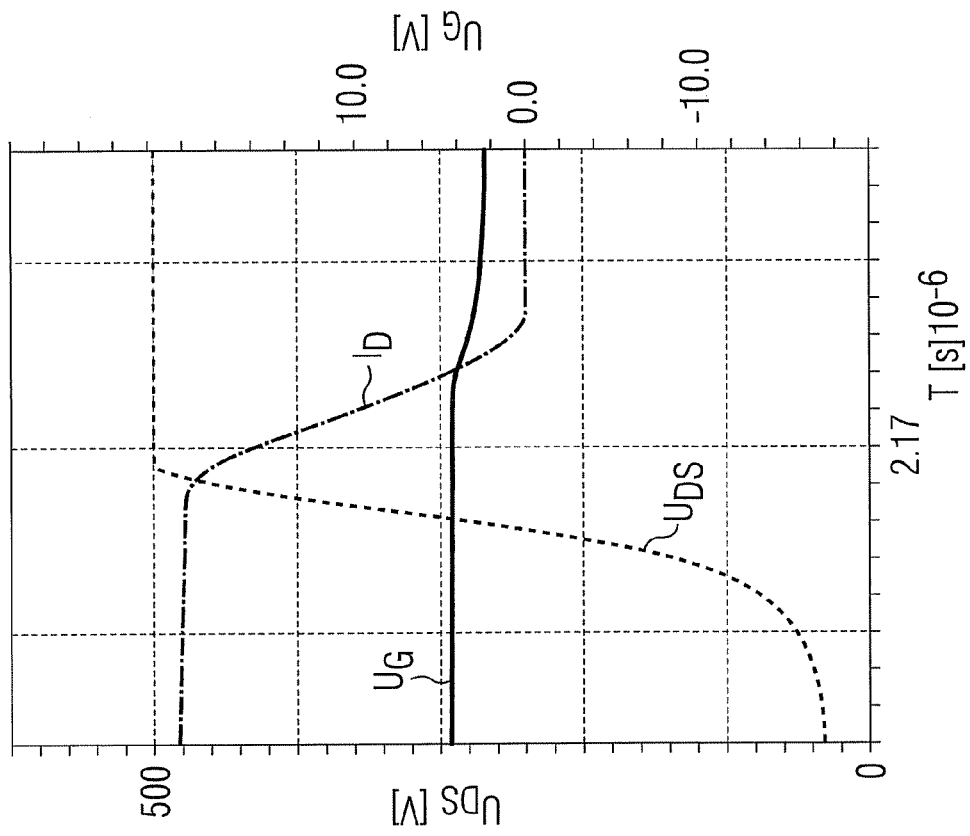
FIG. 21 illustrates an enlarged section of the diagram according to FIG. 19.

FIG. 21 illustrates an enlarged section of the diagram according to FIG. 19. FIG. 22 is a correspondingly enlarged section of the diagram according to FIG. 21.

These enlarged sections illustrate clearly that there are no significant differences in edge steepness, which remains virtually unchanged in spite of the increased layer thickness above the drift zones.

Figure 23:
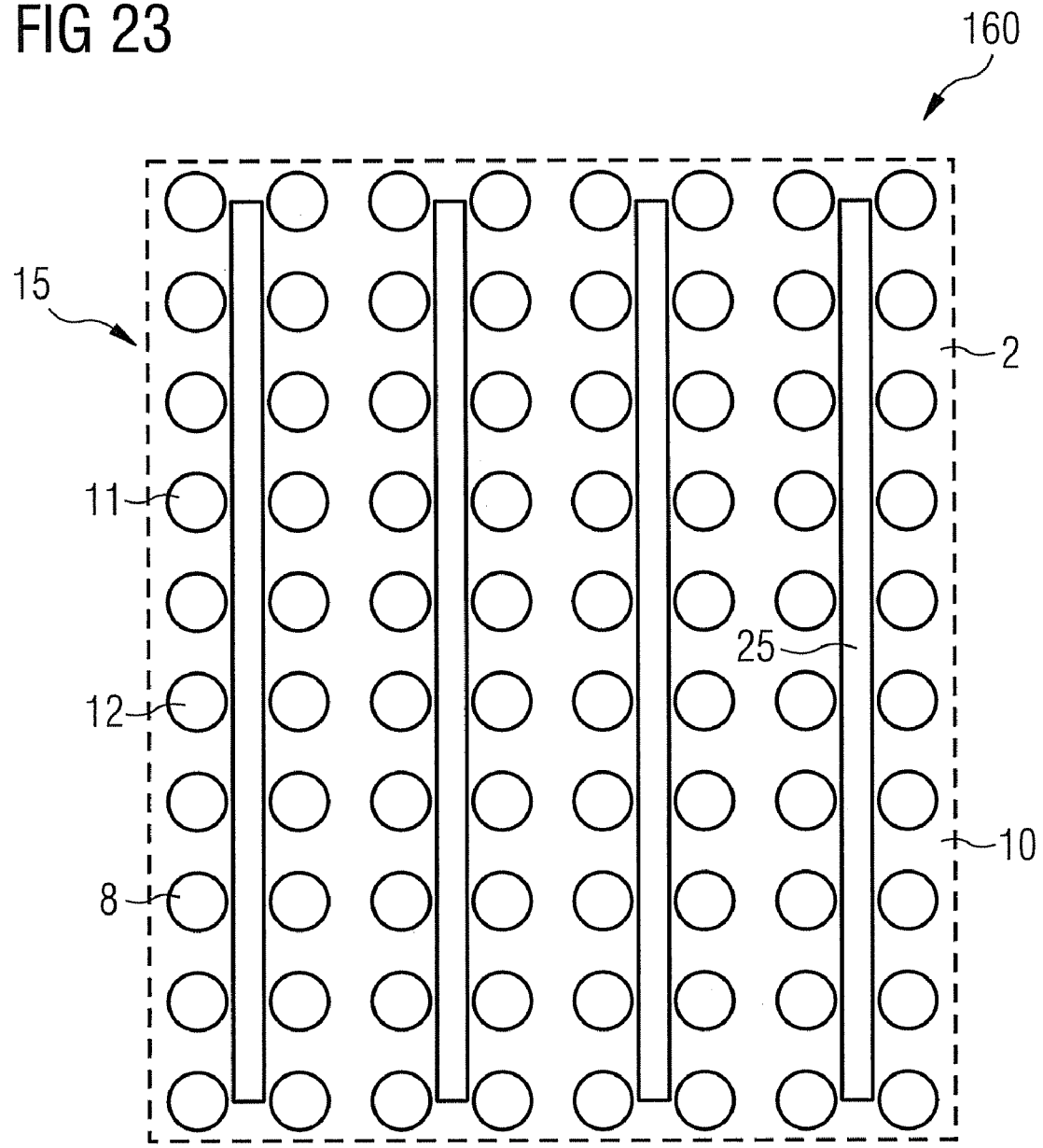
FIG. 23 illustrates a diagrammatic horizontal arrangement of a cell region of a semiconductor device of a further embodiment.

FIG. 23 illustrates a diagrammatic horizontal arrangement of a cell region 15 of a semiconductor device 160 of a further embodiment. The semiconductor device 160 includes conductively connected charge compensation zones 12 and regions of a thicker insulating layer 25. In this semiconductor device 160, the regions of a thicker insulating layer 25 are strip-shaped and only provided between each second row of the conductively connected charge compensation zones 12.

Figure 24:
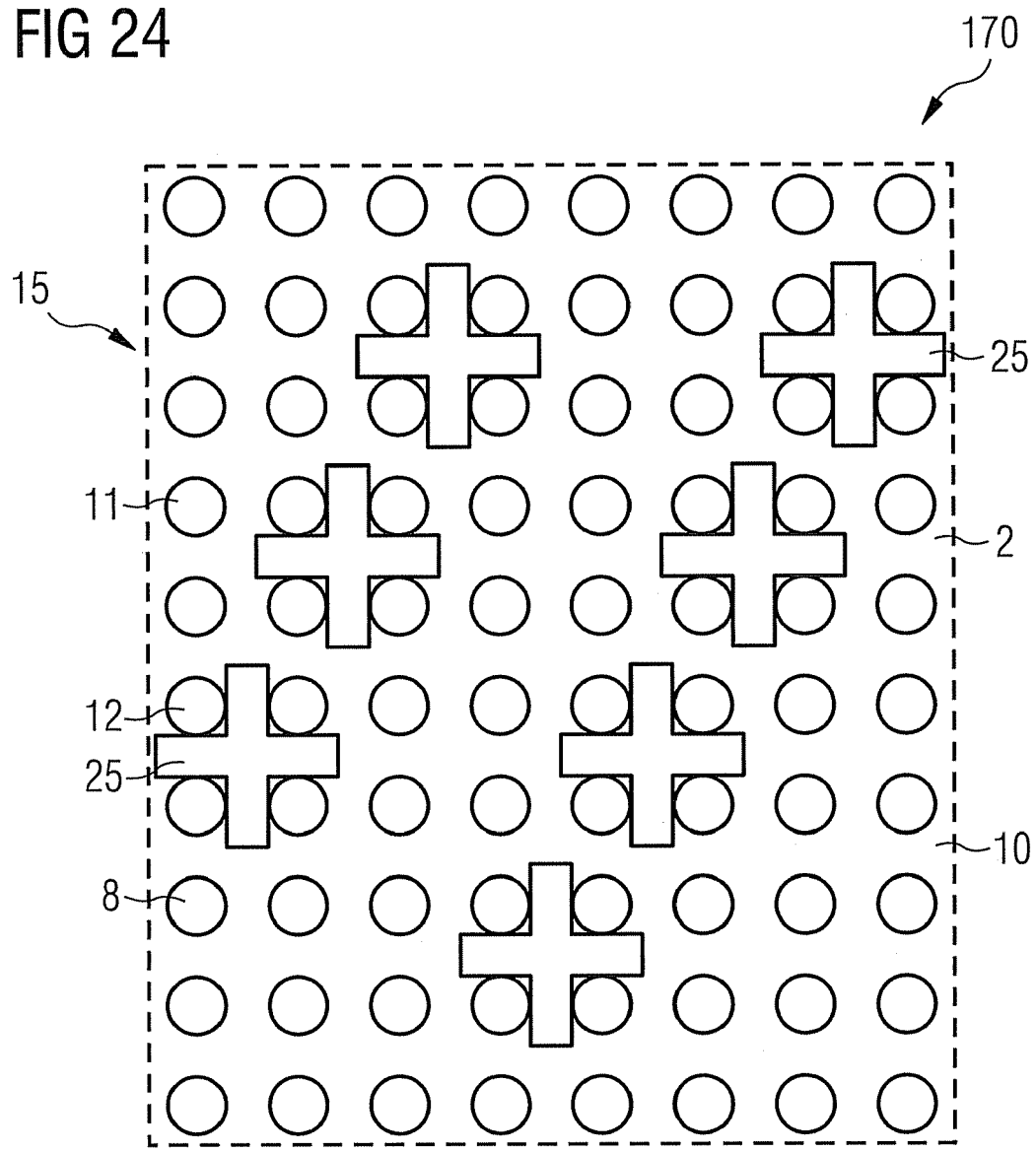
FIG. 24 illustrates a diagrammatic arrangement of a cell region of a semiconductor device of a further embodiment.

FIG. 24 illustrates a diagrammatic arrangement of a cell region 15 of a semiconductor device 170 of a further embodiment. The semiconductor device 170 includes conductively connected charge compensation zones 12 and regions of a thicker insulating layer 25. The regions with the thicker insulating layer 25 are however located at entirely different points of the cell region 15, in order to illustrate that different geometrical arrangements can be used for the thicker insulating layer 25 to obtain a suitably low gate charge for an optimum shut-down behavior of the semiconductor device 170.

Figure 25:
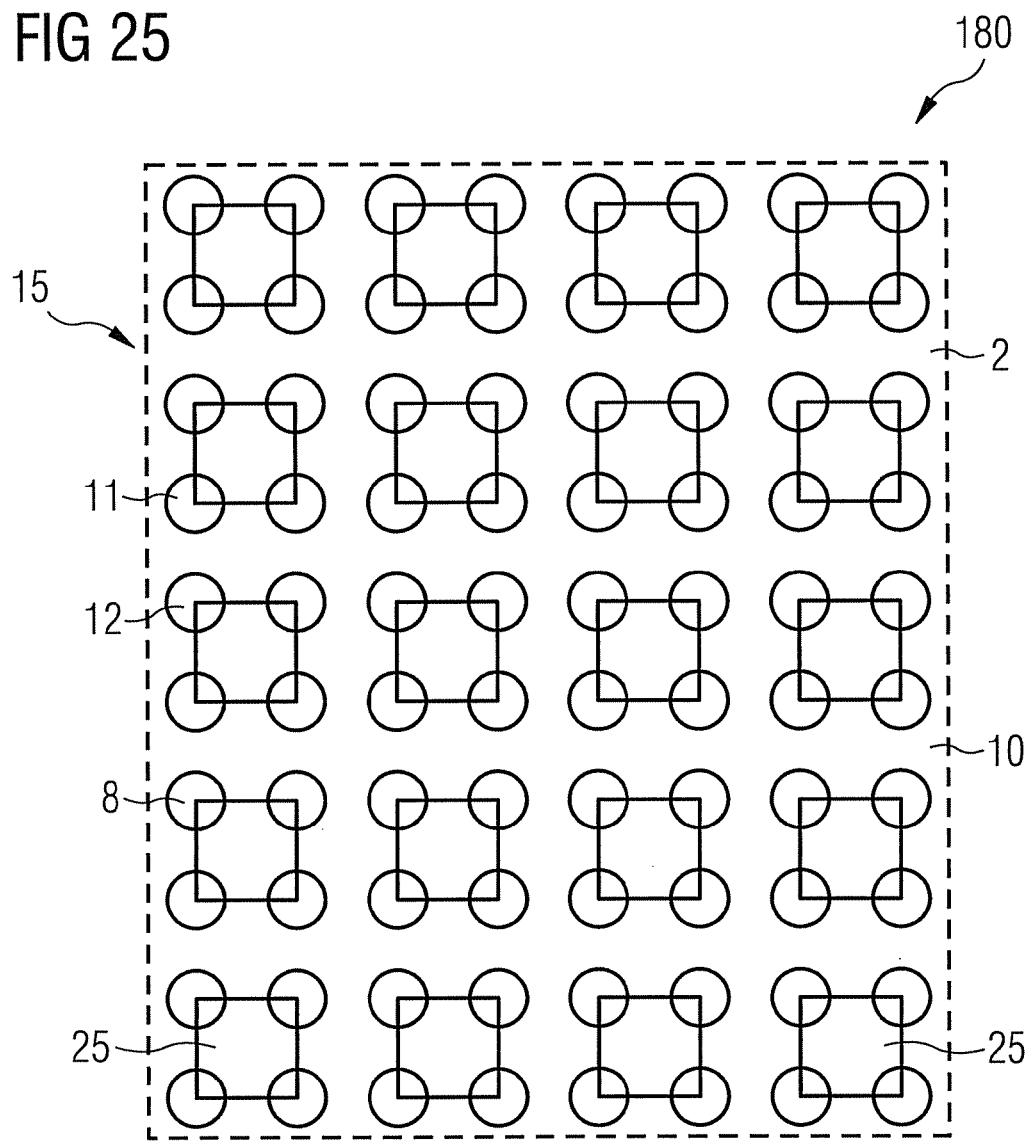
FIG. 25 illustrates a diagrammatic arrangement of a cell region of a further embodiment.

FIG. 25 illustrates a diagrammatic arrangement of a cell region 15 of a semiconductor device 180 of a further embodiment. The semiconductor device 180 includes conductively connected charge compensation zones 12 and regions of a thicker insulating layer 25. These regions with a thicker insulating layer 25 partially extend across the charge compensation zones, so that the thickening extends over the body zone. In these overlapping regions it is impossible to form a channel in the body zone. By using the thicker oxide, it is therefore possible to vary the transconductance of the transistor.

Figure 26:
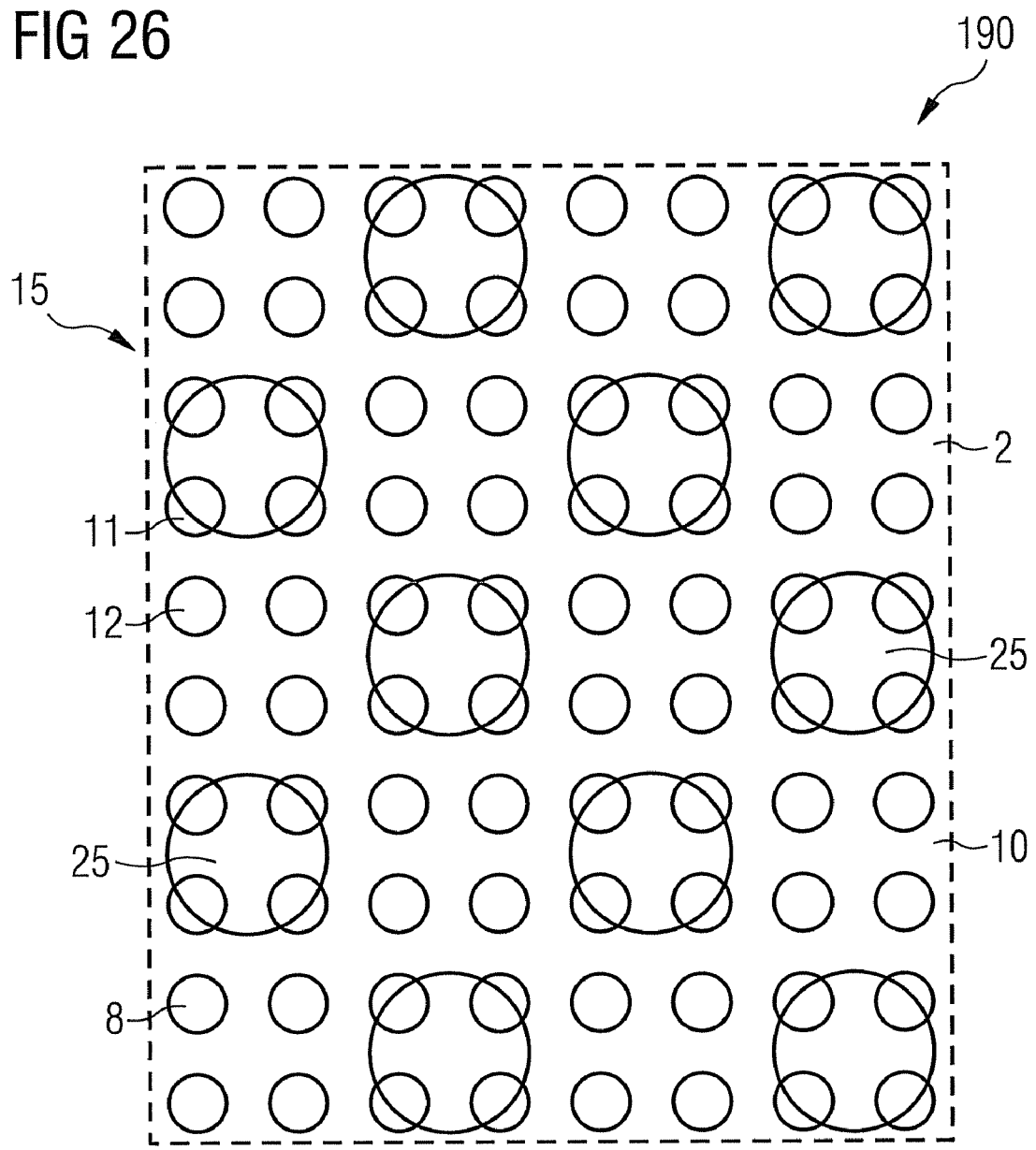
FIG. 26 illustrates a diagrammatic arrangement of a cell region of a semiconductor device of a further embodiment.

While the thicker insulating layer 25 is designed as square areas in FIG. 25, FIG. 26 illustrates a further embodiment, this being a semiconductor device 190 with a circular thick insulating layer 25, which likewise partially overlaps body zones or conductively connected charge compensation zones 12.

Figure 27:
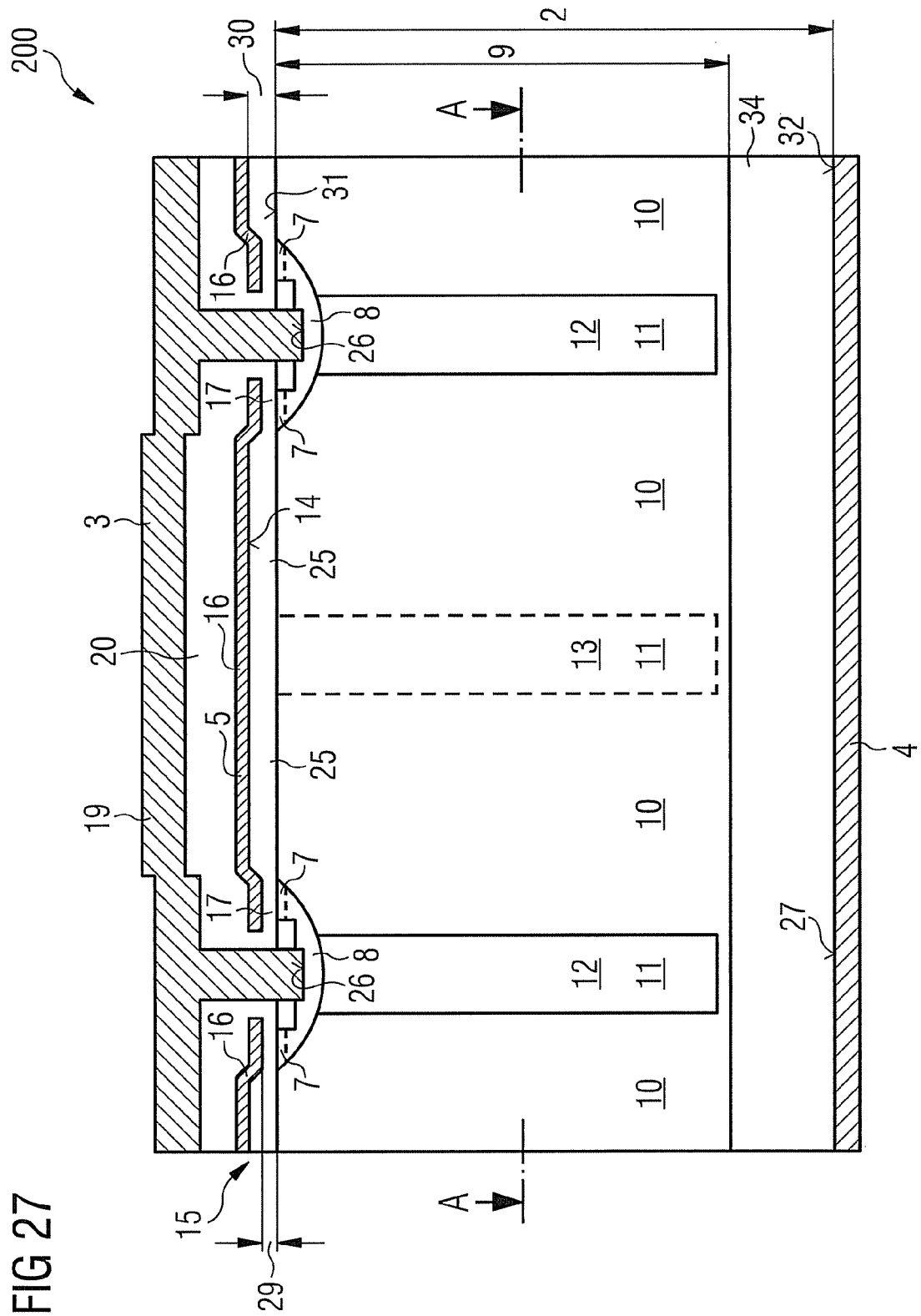
FIG. 27 illustrates a diagrammatic cross-section through a part of a semiconductor device according to a further embodiment.

FIG. 27 illustrates a diagrammatic cross-section through a part of a semiconductor device 200 according to a further embodiment. In this embodiment the thicker insulating layer 25 is located in regions where there are nearly-floating charge compensation zones of the semiconductor body 2. Components of the same function as those illustrated in the preceding figures are identified by the same reference numbers and not explained again. In the channel region 7 of the body zone 8, the insulating layer has a reduced thickness 29, while a thicker insulating layer 25 is provided above the drift zone 10 and the nearly-floating charge compensation zones 13 in order to reduce the gate charge without affecting the effect of the increased feedback capacitance $C_{GD}$.

Figure 28:
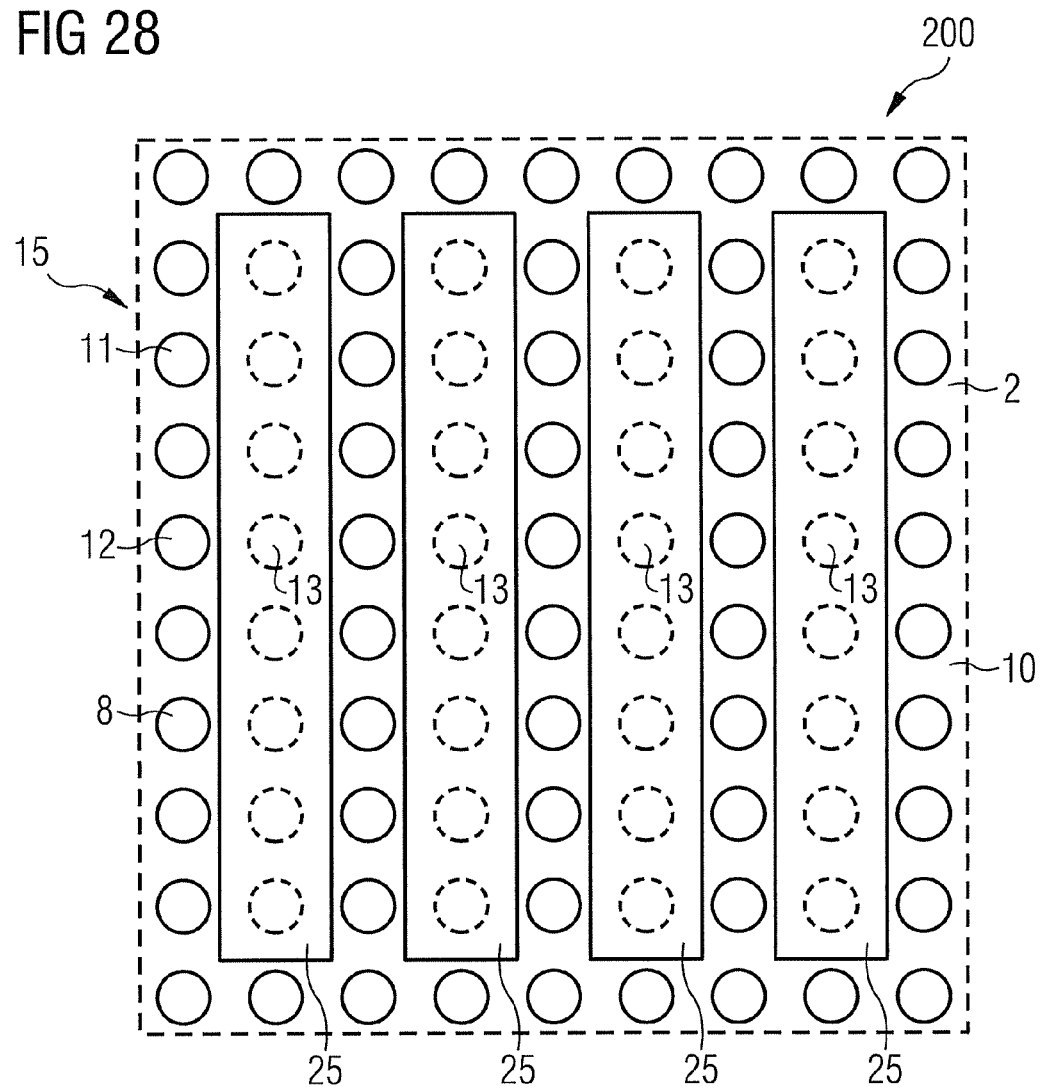
FIG. 28 illustrates a horizontal section of a cell region along intersecting plane A-A in FIG. 23.

FIG. 28 illustrates a horizontal section of a cell region 15 along intersecting plane A-A in FIG. 27. Regions of a greater oxide thickness 30 and thus of a thicker insulating layer 25 are surrounded by continuous lines, the thicker insulating layer 25 being located above the nearly-floating charge compensation zones 13 in this semiconductor device 200.

Figure 29:
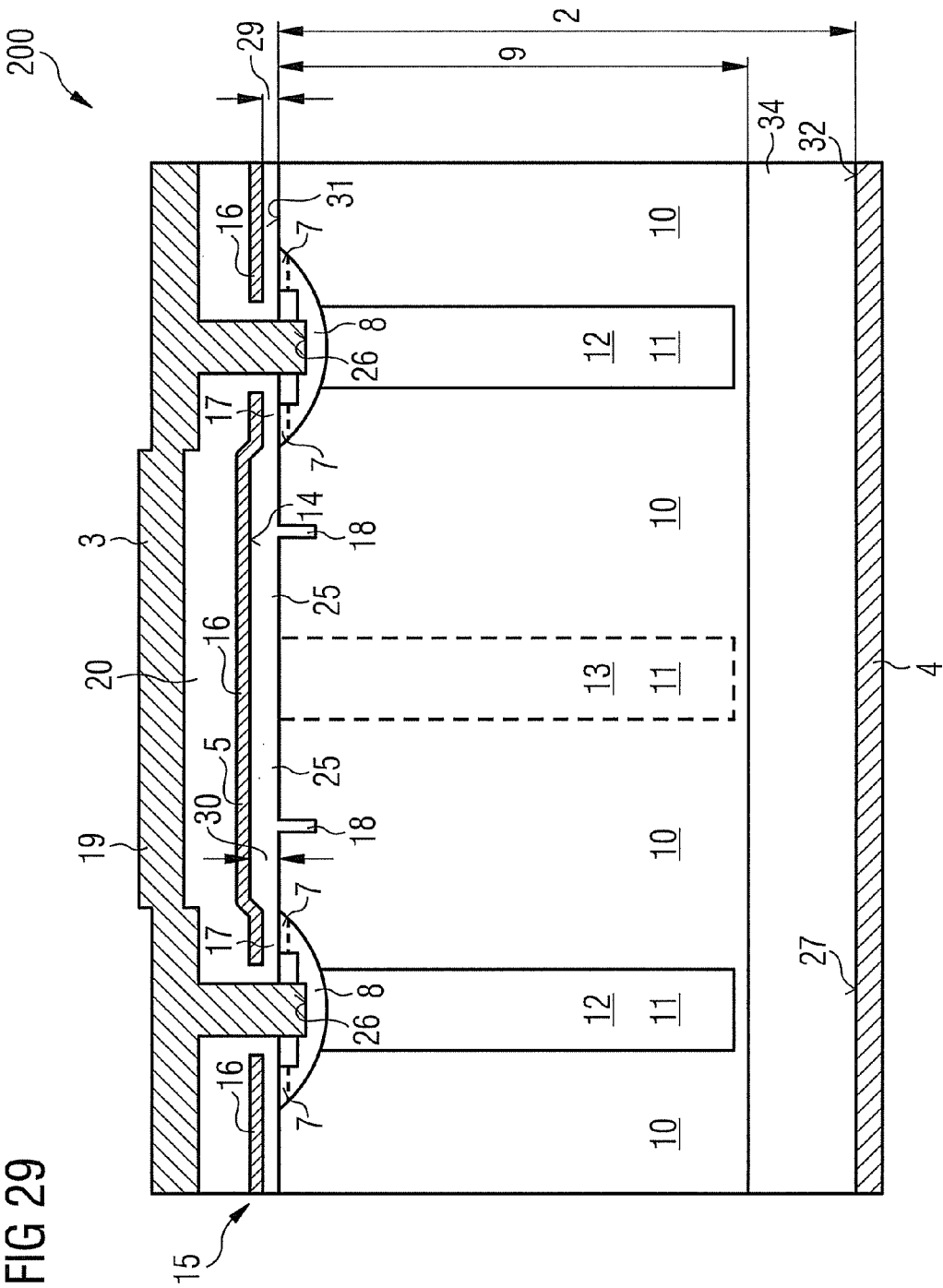
FIG. 29 illustrates a diagrammatic cross-section through a part of a semiconductor device according to a further embodiment.

FIG. 29 illustrates a diagrammatic cross-section through a part of a semiconductor device 210 according to a further embodiment. This embodiment differs from the previously described embodiments in that a trench structure 18 filled with a dielectric surrounds the nearly-floating charge compensation zones 13, and in that a greater oxide thickness 30 is provided for the insulating layer 25 above the drift zone 10 and the pillar-shaped nearly-floating charge compensation zones 13.

FIG. 30 illustrates a diagrammatic section through a cell region 15 of a semiconductor device 220 according to a further embodiment, wherein groups of nearly-floating charge compensation zones 13 are provided in the cell region, with a thicker insulating layer 25 located above.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit device comprising:
 a vertical MOSFET with vertical charge compensation comprising:
 a semiconductor body with a first electrode and a second electrode located on opposite surfaces of the semiconductor body;
 a control electrode on an insulating layer, which controls channel regions of body zones in the semiconductor body for a current flow between the two electrodes;
 a vertical drift section having vertical drift zones adjoining the channel regions within a cell region;
 vertical charge compensation zones adjacent the vertical drift zones of the vertical drift section within a cell region;
 the vertical charge compensation zones having a first part electrically connected to the first electrode;
 the vertical charge compensation zones having a second part including nearly-floating charge compensation zones arranged below a polysilicon layer that forms an enlarged control electrode surface and is connected to a control electrode potential and provides a monolithically integrated additional capacitance $G_{ZGD}$ in the cell region of the vertical MOSFET, wherein an insulating layer forms a dielectric layer for the additional capacitance $C_{ZGD}$ in the region of the enlarged control electrode and the nearly-floating charge compensation zones; and
 wherein the nearly-floating charge compensation zones are electrically connected to one another or to a body zone or to one of the conductively connected charge compensation zones by a layer of a second conduction type within the semiconductor.

2. The integrated circuit device of claim 1, wherein the drift zones comprise a first conduction type and the charge compensation zones comprise the second conduction type complementing the first conduction type.

3. The integrated circuit device of claim 1, wherein the first electrode is a source electrode, the second electrode is a drain electrode and the control electrode is a gate electrode of a power MOSFET device.

4. The integrated circuit device of claim 1, wherein the region of the nearly-floating charge compensation zones is additionally covered by a metal layer with the potential of the first electrode and is insulated against the electrically conductive layer of the additional capacitance by an intermediate insulating layer.

5. The integrated circuit device of claim 1, wherein conductively connected charge compensation zones are doped more highly near the surface than in the remaining region of the drift section and the nearly-floating charge compensation zones do not comprise this more highly doped region.

6. The integrated circuit device of claim 1, wherein the drift zones comprise a first conduction type and the nearly-floating charge compensation zones, the body zone, and the conductively connected charge compensation zones comprise the second conduction type which complements the first conduction type.

7. A method comprising:
 structuring a semiconductor body with semiconductor device structures in semiconductor chip positions from a semiconductor wafer, which comprise vertical MOSFET structures with vertical charge compensation, connecting zones of a first electrode and connecting zones of a second electrode situated on opposite sides of the semiconductor body, between which a vertical drift section is located, wherein the vertical drift section comprises vertical drift zones adjoining channel regions within a cell region, vertical charge compensation zones adjacent the vertical drift zones of the vertical drift section within a cell region, a first part of the vertical charge compensation zones being electrically connected to the first electrode, a second part of the vertical charge compensation zones arranged to be nearly-floating in a cell region;
 applying, a structured dielectric layer which insulates connecting zones of a control electrode and partially extends across the nearly-floating vertical charge compensation zones;
 applying an electrically conductive layer on the dielectric layer, wherein the electrically conductive layer forms the connecting zones of the control electrode, the electrically conductive layer together with the control electrode and the nearly-floating charge compensation zones forming a monolithically integrated additional capacitance $C_{ZGD}$ within the cell region of the semiconductor device; and providing a layer of a second conduction type electrically connecting the nearly-floating charge compensation zones to one another or to a body zone or the conductively connected first part of the charge compensation zones.

8. The method of claim 7, wherein a thinner structured dielectric layer is applied in the region of the connecting zones of the control electrode above channel regions than above the nearly-floating charge compensation zones.

9. The method of claim 7, wherein, when the structured dielectric layer is applied in the region of the connecting zones above channel regions, the structured electrically conductive layer is used as gate oxide.

10. The method of claim 7, wherein, in the region of the nearly-floating charge compensation zones, the layers are applied to the front side of the dielectric body in the sequence of dielectric layer, intermediate insulating layer and metal layer.

11. The method of claim 7, wherein a higher concentration of doping material is used for conductively connected charge compensation zones in a near-surface region than in the remaining region of the drift section, and wherein there is no such increased doping in the near-surface region for the nearly-floating charge compensation zones.

12. The method of claim 7, wherein the drift zones comprise a first conduction type and the nearly-floating charge compensation zones, the body zone, and the conductively connected charge compensation zones comprise the second conduction type which complements the first conduction type.

* * * * *

UNITED STATES PATENT AND TRADEMARK OFFICE
CERTIFICATE OF CORRECTION

PATENT NO. : 8,294,206 B2
APPLICATION NO. : 13/161130
DATED : October 23, 2012
INVENTOR(S) : Armin Willmeroth et al.

Page 1 of 1

It is certified that error appears in the above-identified patent and that said Letters Patent is hereby corrected as shown below:

Column 12, line 3, delete "$G_{ZGD}$" and insert in place thereof --$C_{ZGD}$--.

Signed and Sealed this
Twenty-second Day of January, 2013

David J. Kappos
*Director of the United States Patent and Trademark Office*